(12) United States Patent
Doki et al.

(10) Patent No.: US 7,884,622 B2
(45) Date of Patent: Feb. 8, 2011

(54) METHOD OF ADJUSTING MOVING POSITION OF TRANSFER ARM AND POSITION DETECTING JIG

(75) Inventors: Yuichi Doki, Koshi (JP); Koji Mahara, Koshi (JP); Tokutarou Hayashi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 246 days.

(21) Appl. No.: 12/192,405

(22) Filed: Aug. 15, 2008

(65) Prior Publication Data

US 2009/0051370 A1 Feb. 26, 2009

(30) Foreign Application Priority Data

Aug. 24, 2007 (JP) ............................... 2007-217820

(51) Int. Cl.
*G01R 27/26* (2006.01)
(52) U.S. Cl. ...................... 324/658; 324/662
(58) Field of Classification Search ................. 324/765, 324/658, 662
See application file for complete search history.

(56) References Cited

U.S. PATENT DOCUMENTS

2009/0033908 A1* 2/2009 Matsumoto et al. ........... 355/75

FOREIGN PATENT DOCUMENTS

| JP | 2003-243479 | 5/2003 |
|----|-------------|--------|
| JP | 2003-203965 | 7/2003 |
| JP | 2003-218186 | 7/2003 |
| JP | 2005-19963  | 1/2005 |
| JP | 2005-300329 | 10/2005 |
| JP | 2006-351751 | 12/2006 |

* cited by examiner

*Primary Examiner*—Vincent Q Nguyen
(74) *Attorney, Agent, or Firm*—Oblon, Spivak, McClelland, Maier & Neustadt, L.L.P.

(57) ABSTRACT

In the present invention, a position detecting substrate having a capacitive sensor is supported on a transfer arm and transferred by the transfer arm and mounted on a mounting part. The capacitive sensor on the position detecting substrate then detects a position of a target object on the mounting part to detect a mounting position of the position detecting substrate on the mounting part. Based on the mounting position of the position detecting substrate, the moving position of the transfer arm when transferring a substrate is then adjusted.

7 Claims, 18 Drawing Sheets

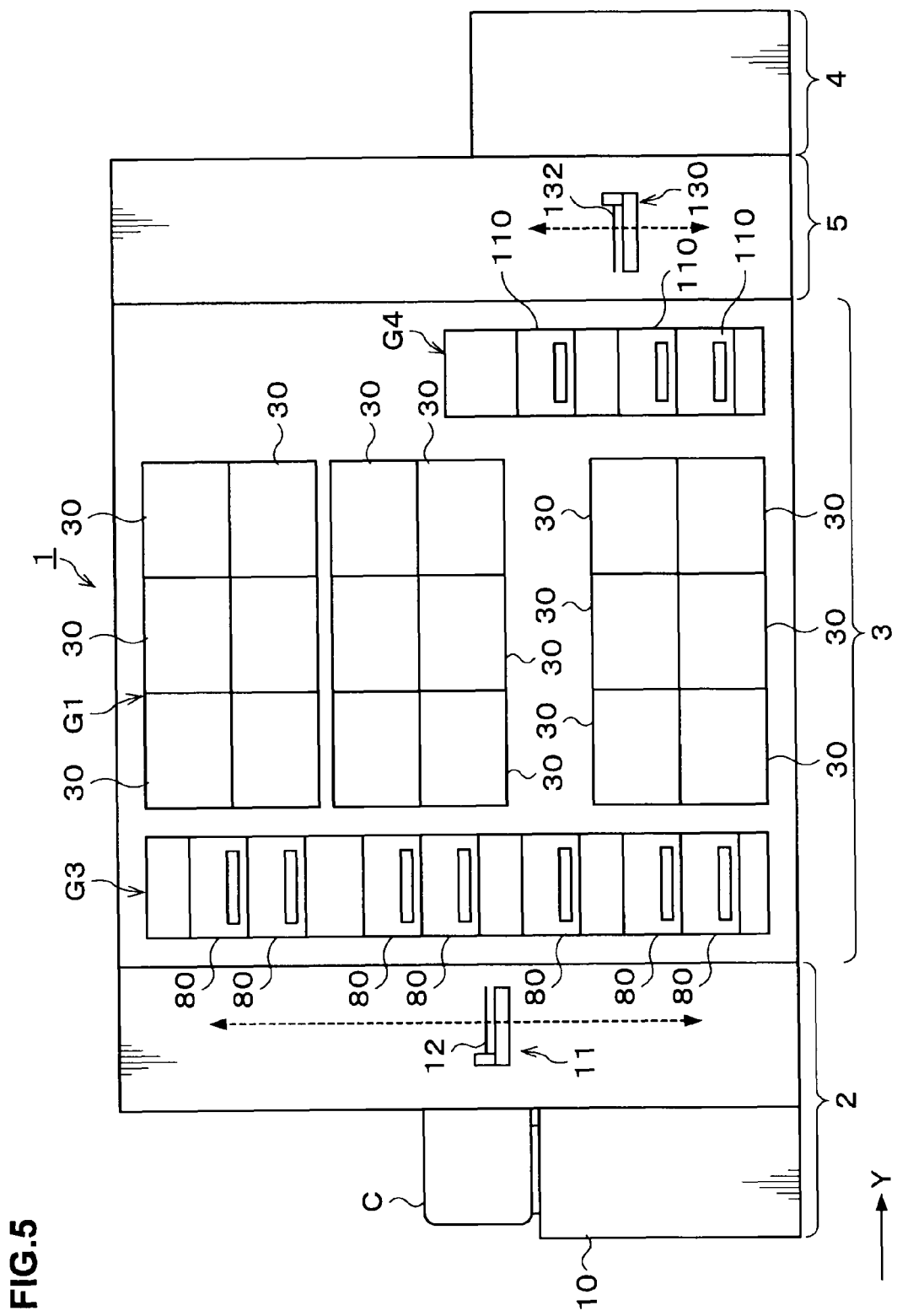

METHOD OF ADJUSTING MOVING POSITION OF TRANSFER ARM AND POSITION DETECTING JIG

BACKGROUND OF THE INVENTION

1. Field of the Invention

The present invention relates to a method of adjusting a moving position of a transfer arm transferring a substrate to a mounting part for mounting a substrate thereon and a position detecting jig.

2. Description of the Related Art

The photolithography process in manufacturing, for example, a semiconductor device is usually performed in a coating and developing treatment system incorporating a plurality of units such as a resist coating unit, a developing treatment unit, a thermal processing unit and so on. In the coating and developing treatment system, a transfer unit for transfer of a wafer to the units is provided.

The aforementioned transfer unit has a transfer arm for holding the wafer, and the transfer arm moves in three dimensions in the front-to-back direction, the right-to-left direction and the top-to-bottom direction to transfer the wafer to the units.

However, if the wafer is not transferred to a predetermined mounting part in each of the units, for example, delivery of the wafer is not appropriately performed or processing to the wafer is not appropriately performed. Therefore, it is verified whether or not the transfer arm transfers the wafer to a predetermined position at a start up operation of the coating and developing treatment system, so that if the position to which the wafer has been transferred is displaced, the position adjustment of a transfer destination of the transfer arm is performed.

As the method of position adjustment, it is proposed to hold, for example, a trace detecting wafer having a CCD camera mounted thereon by a transfer arm, transfer the trace detecting by the transfer arm, and detect a stop position at the transfer destination of the transfer arm by the CCD camera (Japanese Patent Application Laid-open No. 2003-243479).

SUMMARY OF THE INVENTION

However, an optical device such as the aforementioned CCD camera or the like needs to have an adequate thickness in the vertical direction because of constraints of a focus distance and an adjustment mechanism for focus. Therefore, it is impossible to transfer the trace detecting wafer into a unit having a reduced space of the transfer port which has been reduced in thickness in recent year, with the result that the position adjustment work cannot be appropriately performed sometimes. Besides, a general CCD camera is not sufficiently high in accuracy of detecting the position, while a high-precision CCD camera is expensive. Therefore, the position adjustment using a position detecting jig including a CCD camera costs a lot.

The present invention has been developed in consideration of the above points, and its object is to perform adjustment of a moving position of a transfer arm using a position detecting jig which can be transferred into a low-profile unit and is high in accuracy and low in cost.

The present invention to attain the above object is a method of adjusting a moving position of a transfer arm, the transfer arm transferring a substrate to a mounting part for mounting the substrate thereon, the method including the steps of: supporting on the transfer arm a position detecting jig in a substrate shape having a capacitive sensor, the capacitive sensor being capable of detecting a capacitance between the capacitive sensor and a target object to detect a relative position to the target object; transferring the position detecting jig by the transfer arm and mounting the position detecting jig onto the mounting part; detecting a position of the position detecting jig with respect to a target object formed on the mounting part by the capacitive sensor on the position detecting jig to detect a mounting position of the position detecting jig on the mounting part; and adjusting a moving position of the transfer arm when transferring the position detecting jig based on the mounting position of the position detecting jig.

According to the present invention, the position detecting jig can be greatly reduced in thickness by using the capacitive sensor. Therefore, the position detecting jig can be transferred even into a low-profile unit so that the adjustment of the moving position of the transfer arm can be appropriately performed. Further, the capacitive sensor is higher in accuracy and lower in cost than the optical sensor, and therefore can perform the adjustment of the moving position of the transfer arm with a higher accuracy and at a lower cost.

The present invention according to another aspect is a position detecting jig for adjusting a moving position of a transfer arm, the transfer arm transferring a substrate to a mounting part for mounting the substrate thereon. The position detecting jig of the present invention has a substrate shape transferable by the transfer arm. Further, the position detecting jig of the present invention has a capacitive sensor for detecting a capacitance between the capacitive sensor and a target object. The capacitive sensor includes a capacitance detection electrode for forming a capacitance between the capacitance detection electrode and the target object, and a control circuit connected to the capacitance detection electrode for controlling an operation of detecting the capacitance. Further, the capacitance detection electrode has a first capacitance detection electrode provided at a central portion of the substrate shape and capable of detecting a relative position to the target object at a center of the mounting part, and a second capacitance detection electrode provided at a position corresponding to a support portion of the transfer arm.

BRIEF DESCRIPTION OF THE DRAWINGS

FIG. 5 is a side view showing a configuration of the inside of the coating and developing treatment system;

DETAILED DESCRIPTION OF THE INVENTION

Figure 1:
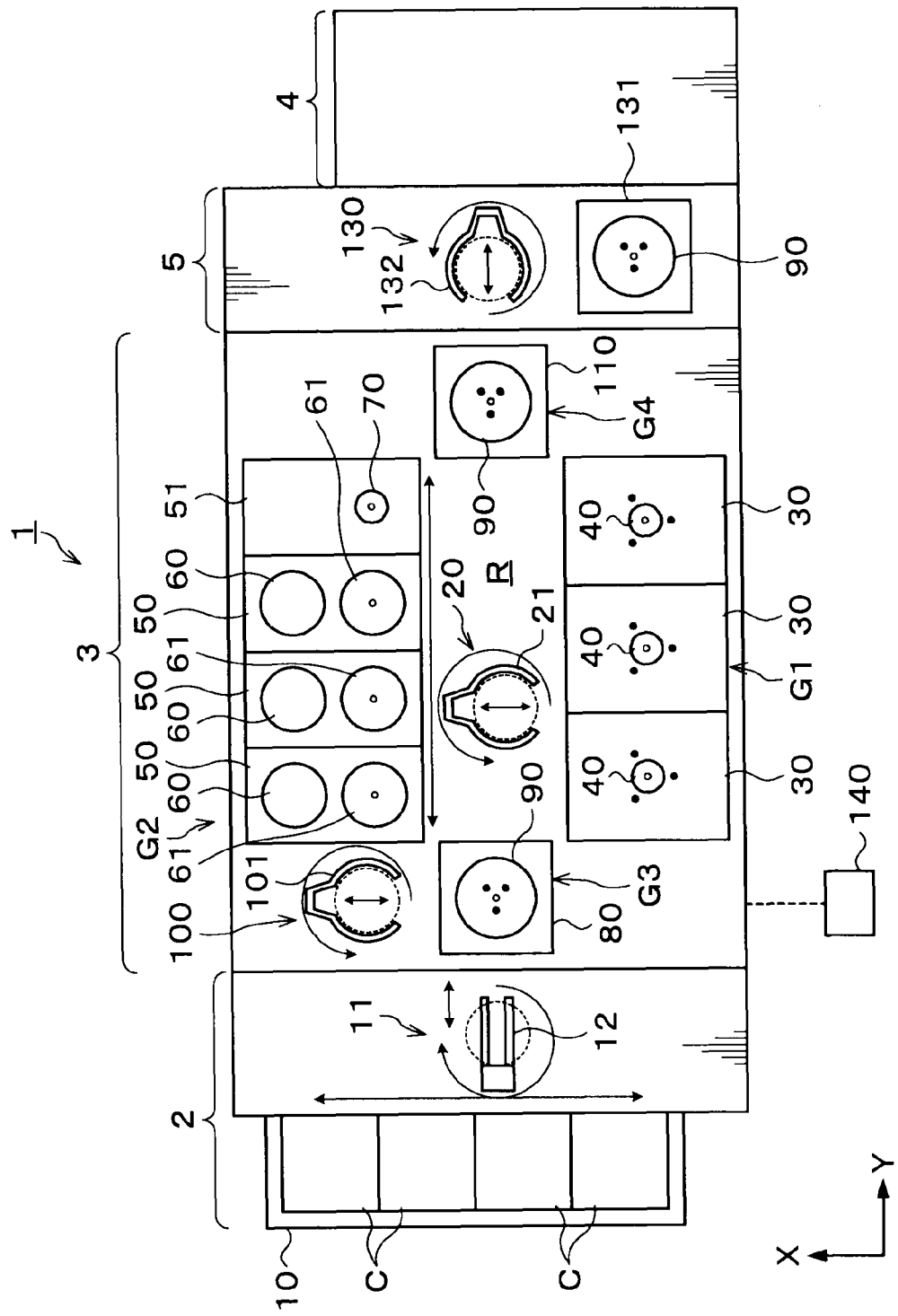
FIG. 1 is a plan view showing the outline of a coating and developing treatment system.

Hereinafter, embodiment of the present invention will be described. FIG. 1 is a plan view showing the outline of a configuration of a coating and developing treatment system 1 to which a method of adjusting a moving position of a transfer arm according to the present invention is applied.

The coating and developing treatment system 1 has, as shown in FIG. 1, a configuration in which, for example, a cassette station 2 for transferring a plurality of wafers W per cassette as a unit, for example, from/to the outside into/from the coating and developing treatment system 1; a processing station 3 including a plurality of various kinds of processing and treatment units for performing predetermined processing or treatment in a manner of single wafer processing in the photolithography processing; and an interface station 5 for delivering the wafers W to/from an aligner 4 adjacent to the processing station 3, are integrally connected together.

Figure 2:
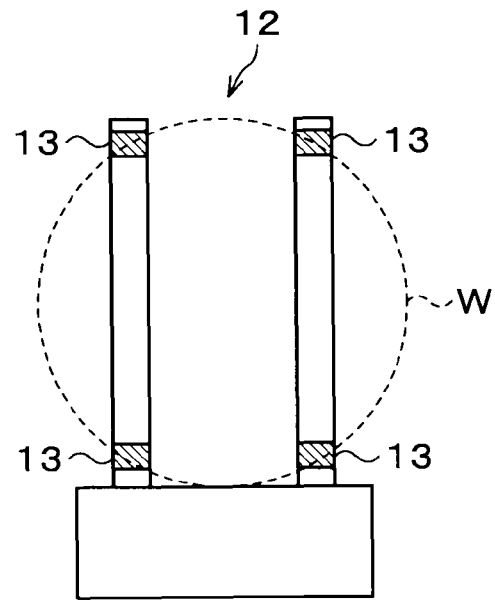
FIG. 2 is an explanatory view showing a configuration of a transfer arm.

In the cassette station 2, a cassette mounting table 10 is provided on which a plurality of cassettes C can be mounted in a line in an X-direction. In the cassette station 2, for example, a wafer transfer unit 11 is provided. The wafer transfer unit 11 has a transfer arm 12 which is movable, for example, in a X-direction, a Y-direction, a θ-direction around a vertical axis, and a top-to-bottom direction. The transfer arm 12 has, for example, two linear arms as shown in FIG. 2, and can horizontally support the wafer W on support portions 13 of the arms. The transfer arm 12 can transfer the wafer W to the cassettes C on the cassette mounting table 10 and later-described delivery units 80 included in a third block G3 in the processing station 3.

As shown in FIG. 1, a wafer transfer region R in which a wafer transfer unit 20 is disposed is formed at a middle portion of the processing station 3. In the processing station 3, for example, four blocks G1, G2, G3 and G4 each including various processing and treatment units are provided to surround the four sides of the wafer transfer region R. On the front side (the side of the negative direction in the X-direction in FIG. 1) in the processing station 3, the first block G1 is provided, and on the rear side (the side of the positive direction in the X-direction in FIG. 1) in the processing station 3, the second block G2 is provided. Further, on the side of the cassette station 2 (the side of the negative direction in the Y-direction in FIG. 1) in the processing station 3, the third block G3 is provided, and on the side of the interface station 5 (the side of the positive direction in the Y-direction in FIG. 1) in the processing station 3, the fourth block G4 is provided.

Figure 3:
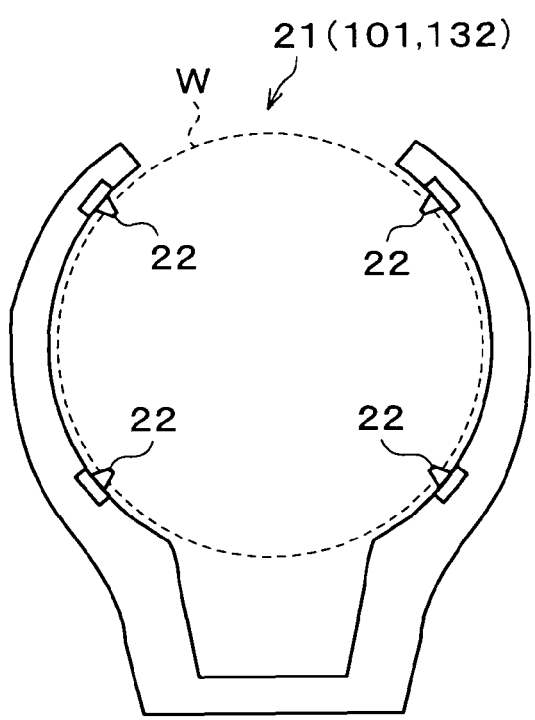
FIG. 3 is an explanatory view showing a configuration of another transfer arm.

The wafer transfer unit 20 has a transfer arm 21 which is movable, for example, in a Y-direction, a front-to-back direction, a θ-direction, and a top-to-bottom direction. The transfer arm 21 has, for example, an almost C-shaped arm having a diameter slightly larger than that of the wafer W as shown in FIG. 3. Inside the almost C-shaped arm, support portions 22 projecting inward for supporting the outer peripheral portion of the wafer W are provided at a plurality of locations. The transfer arm 21 can horizontally support the wafer W on the support portions 22. The transfer arm 21 can move within the wafer transfer region R and transfer the wafer W to a predetermined unit in the first block G1, the second block G2, the third block G3 and the fourth block G4 therearound.

Figure 4:
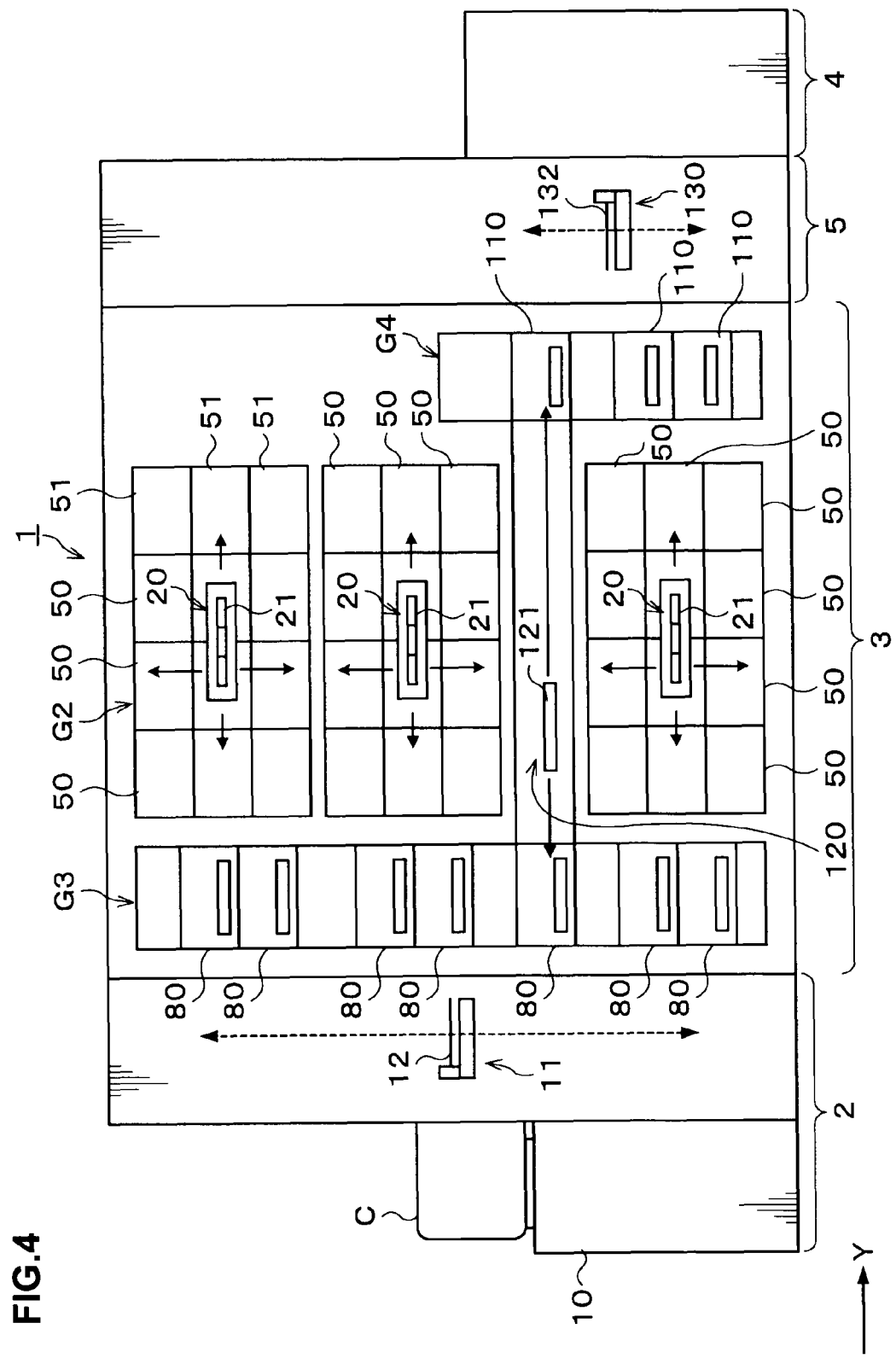
FIG. 4 is a side view showing a configuration of the inside of the coating and developing treatment system.

A plurality of transfer units 20 are stacked, for example, as shown in FIG. 4 and can transfer the wafers W to units at similar heights in the blocks G1 to G4.

For example, in the first block G1, as shown in FIG. 1 to FIG. 5, a plurality of spin-type solution treatment units 30, for example, a developing unit for performing developing treatment on the wafer W, a lower anti-reflection film forming unit for forming an anti-reflection film under a resist film above the wafer W (hereinafter, referred to as a "lower anti-reflection film"), a resist coating unit for applying a resist solution onto the wafer W to form a resist film, and an upper anti-reflection film forming unit for forming an anti-reflection film over the resist film above the wafer W (hereinafter, referred to as an "upper-portion anti-reflection film"), are provided arranged in the vertical direction and the horizontal direction.

Figure 6A:
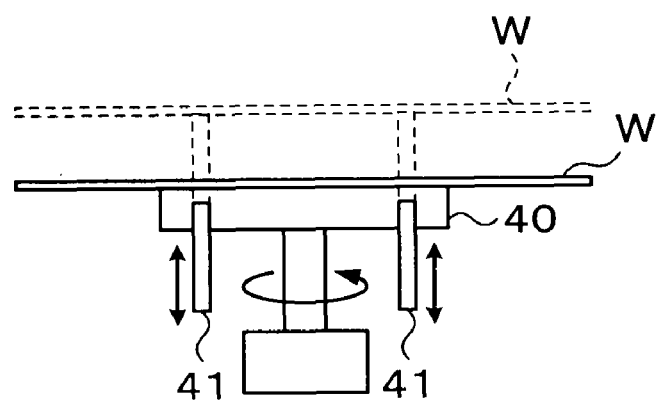
FIG. 6A is a side view showing a configuration of the inside of a spin-type solution treatment unit.
Figure 6B:
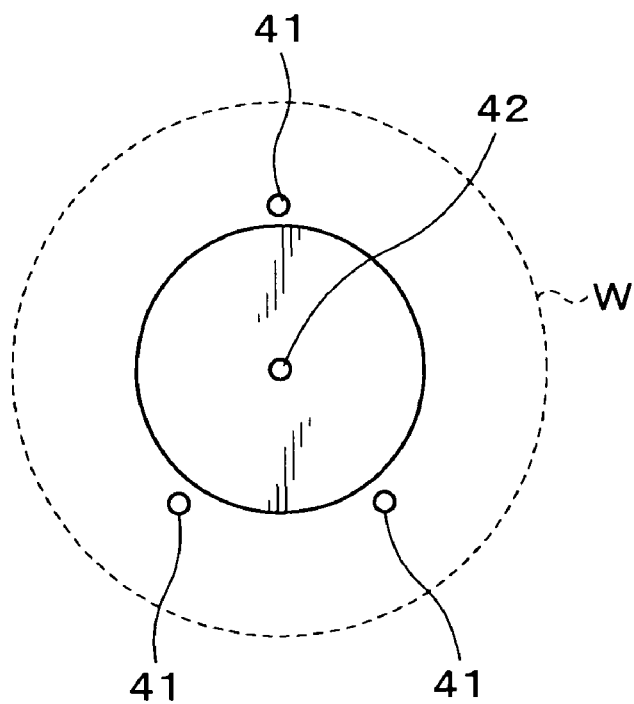
FIG. 6B is a plan view of the inside of the spin-type solution treatment unit.

For example, the spin-type solution treatment unit 30 includes, as shown in FIG. 6A and FIG. 6B, a spin chuck 40 as a mounting part for suction-holding and rotating the wafer W and a plurality of rising/lowering pins 41 as rising/lowering members rising/lowering while supporting the wafer W. For example, the spin chuck 40 is formed such that its diameter is smaller than that of the wafer W, and the plurality of rising/lowering pins 41 are arranged to surround the spin chuck 40. The rising/lowering pins 41 can receive the wafer W from the transfer arm 21 and mount it on the spin chuck 40.

At the center of the upper surface of the spin chuck 40, a bottomed center hole 42 is formed as shown in FIG. 6B. The center hole 42 is used as a target object for detecting the mounting position of the wafer W, for example, by a later-described position detecting wafer S.

For example, in the second block G2, as shown in FIG. 1 and FIG. 4, thermal processing units 50 each for performing heat-processing for the wafer W, and edge exposure units 51 each for exposing the outer peripheral portion of the wafer W to light are arranged in the vertical direction and in the horizontal direction.

For example, the thermal processing unit 50 has, as shown in FIG. 1, a thermal plate 60 for mounting and heating the wafer W thereon and a cooling plate 61 for mounting and cooling the wafer W thereon which are arranged side by side in the horizontal X-direction. The cooling plate 61 is disposed facing the wafer transfer region R, and the thermal plate 60 is disposed on the side opposite to the wafer transfer region R across the cooling plate 61.

Figure 7A:
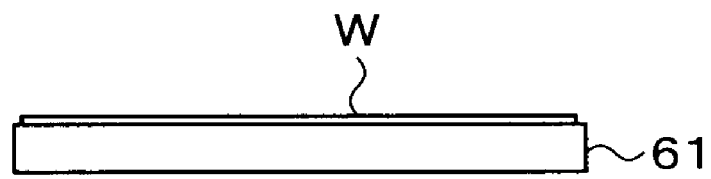
FIG. 7A is a side view showing a configuration of the inside of a thermal processing unit.
Figure 7B:
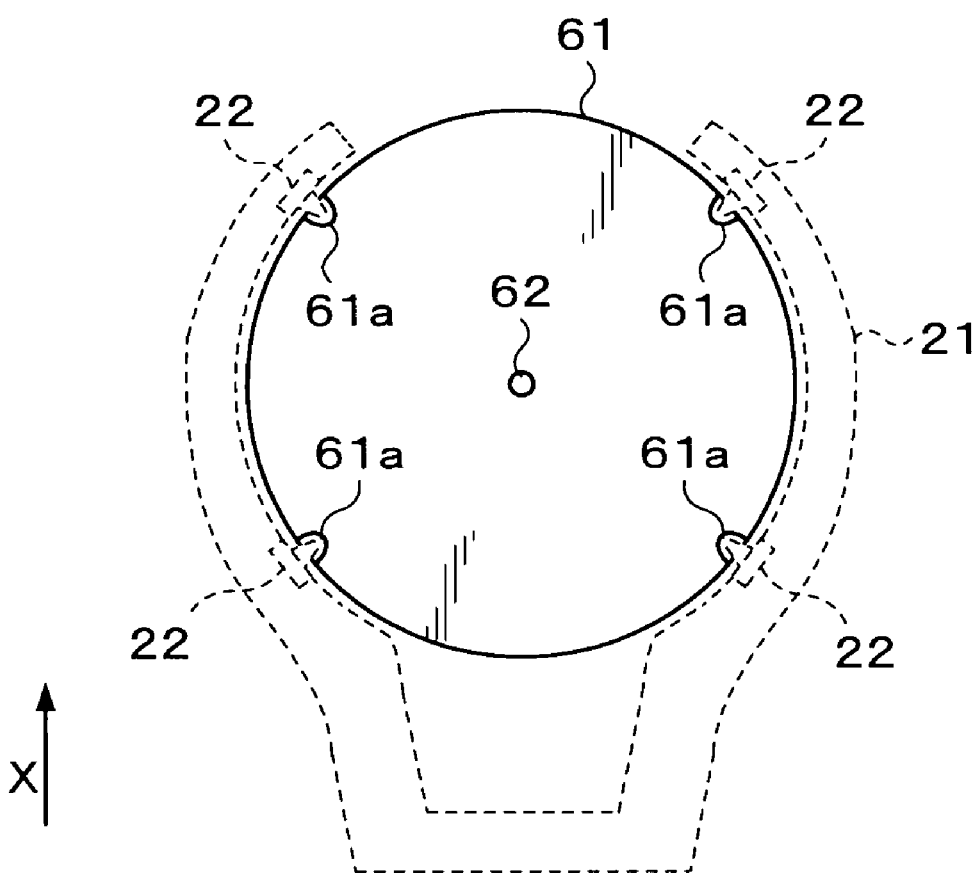
FIG. 7B is a plan view of the inside of the thermal processing unit.

The cooling plate 61 is formed in an almost disk shape having a diameter similar to that of the wafer W as shown in FIG. 7A and FIG. 7B. The outer peripheral portion of the cooling plate 61 is formed with cutout grooves 61$a$ for the support portions 22 of the transfer arm 21 to pass through. This allows the transfer arm 21 to mount the wafer W directly on the cooling plate 61 by entering the space above the cooling plate 61 in the horizontal direction and then lowering to a position lower than the upper surface of the cooling plate 61.

At the center of the upper surface of the cooling plate 61, a bottomed center hole 62 is formed as shown in FIG. 7B. The center hole 62 is used as a target object for detecting the mounting position of the wafer W by the later-described position detecting wafer S. The cooling plate 61 is movable to above the thermal plate 60 to deliver the wafer W to/from the thermal plate 60.

Figure 8:
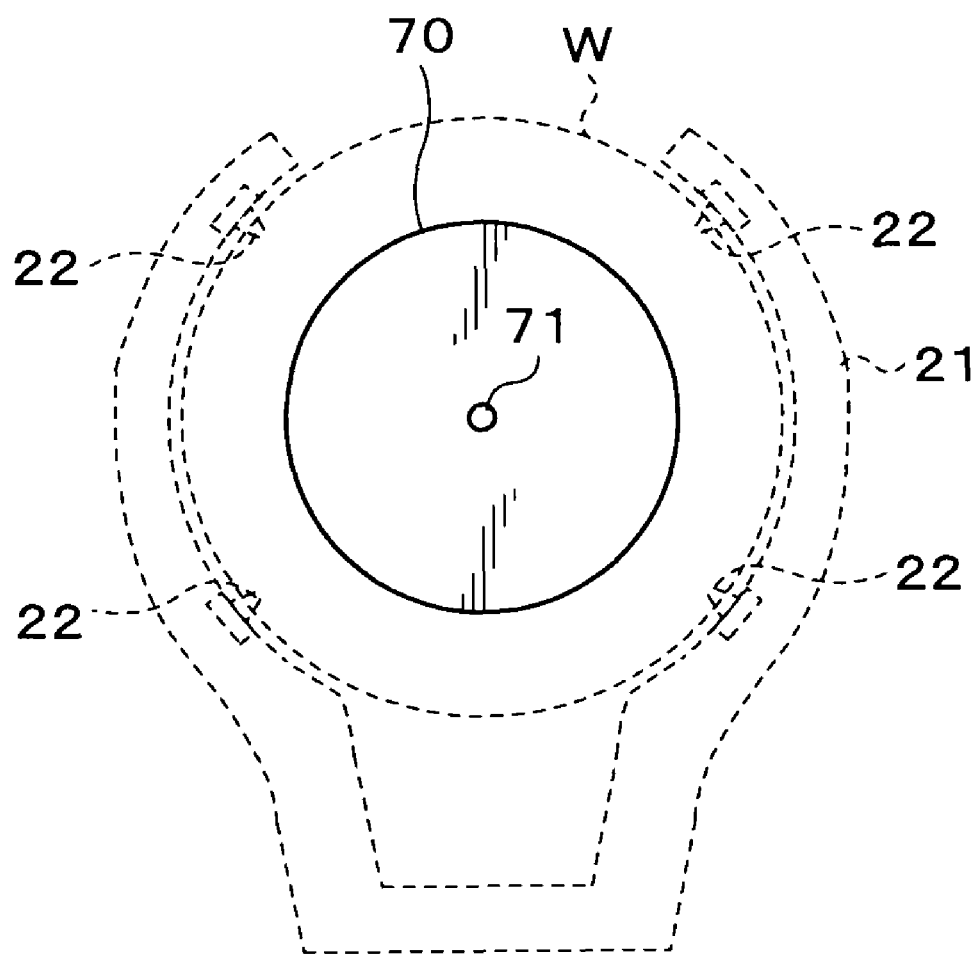
FIG. 8 is a plan view showing a configuration of the inside of an edge exposure unit.

The edge exposure unit 51 includes, as shown in FIG. 1, a chuck 70 as a mounting part for suction-holding the wafer W. The chuck 70 has a diameter smaller than that of the wafer W not to interfere with the support portions 22 of the transfer arm 21 as shown in FIG. 8. This allows the transfer arm 21 to mount the wafer W directly on the chuck 70 by entering the space above the chuck 70 in the horizontal direction and then lowering to a position lower than the upper surface of the chuck 70.

At the center of the upper surface of the chuck 70, a bottomed center hole 71 is formed. The center hole 71 is used as a target object for detecting the mounting position of the wafer W by the later-described position detecting wafer S.

Figure 9A:
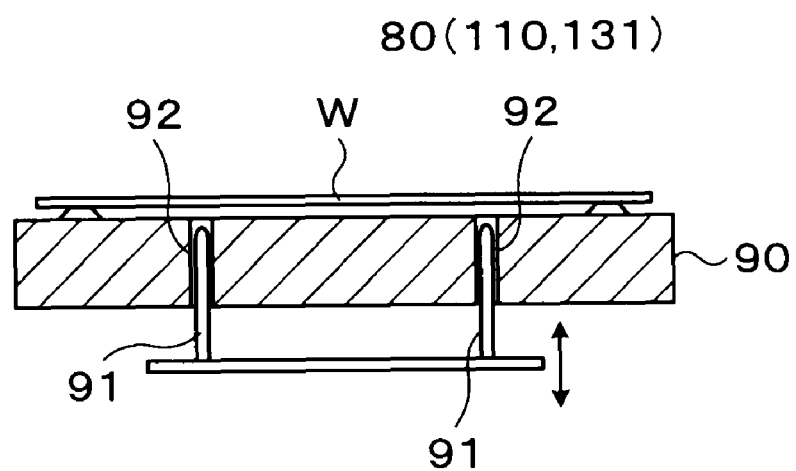
FIG. 9A is a side view showing a configuration of the inside of a delivery unit.
Figure 9B:
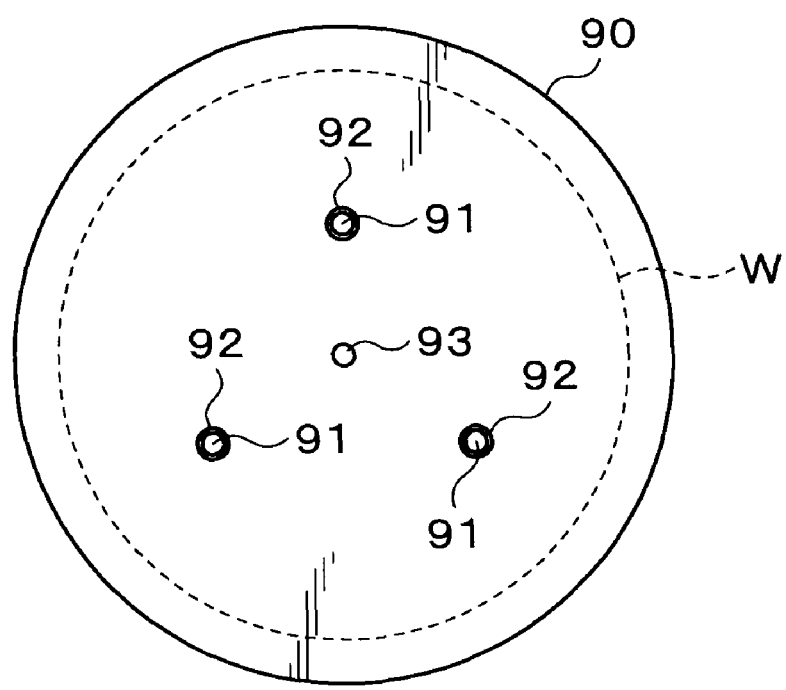
FIG. 9B is a plan view of the inside of the delivery unit.

For example, in the third block G3, as shown in FIG. 4, a plurality of delivery units 80 are provided, stacked one on top of the other. The delivery unit 80 includes, for example, a mounting plate 90 as a mounting part for mounting the wafer W thereon and a plurality of rising/lowering pins 91 as rising/lowering members rising/lowering while supporting the wafer W as shown in FIG. 9A and FIG. 9B. The mounting plate 90 is formed with a plurality of through holes 92 through which the rising/lowering pins 91 can rise and lower. The rising/lowering pins 91 can receive the wafer W from the transfer arm 12, 21 or later-described transfer arm 101 or 121 and mount it onto the mounting plate 90. Note that the mounting plate 90 may have a cooling function and a temperature regulating function, and in this case the delivery unit 80 functions also as a cooling unit and a temperature regulating unit.

At the center of the upper surface of the mounting plate 90, a bottomed center hole 93 is formed as shown in FIG. 9B. The center hole 93 is used as a target object for detecting the mounting position of the wafer W, for example, by the later-described position detecting wafer S.

On the side of the positive direction in the X-direction of the third block G3, a wafer transfer unit 100 is provided as shown in FIG. 1. The wafer transfer unit 100 has a transfer arm 101 which is movable, for example, in a front-to-back direction, a $\theta$-direction, and a top-to-bottom direction. The transfer arm 101 has, for example, the same configuration as that of the above-described transfer arm 21, and has an almost C-shaped arm having a diameter slightly larger than that of the wafer W as shown in FIG. 3. Inside the almost C-shaped arm, support portions 22 protruding inward are provided at a plurality of locations. The transfer arm 101 can vertically move to transfer the wafer W to the delivery units 80 in the third block G3.

For example, in the fourth block G4, as shown in FIG. 4, a plurality of delivery units 110 are provided, stacked one on top of the other. The delivery unit 110 has, for example, the same configuration as that of the above-described delivery unit 80 and includes a mounting plate 90 and a plurality of rising/lowering pins 91 as shown in FIG. 9A and FIG. 9B. The rising/lowering pins 91 can receive the wafer W from the transfer arm 21 or a later-described transfer arm 132 and mount it onto the mounting plate 90.

Figure 10:
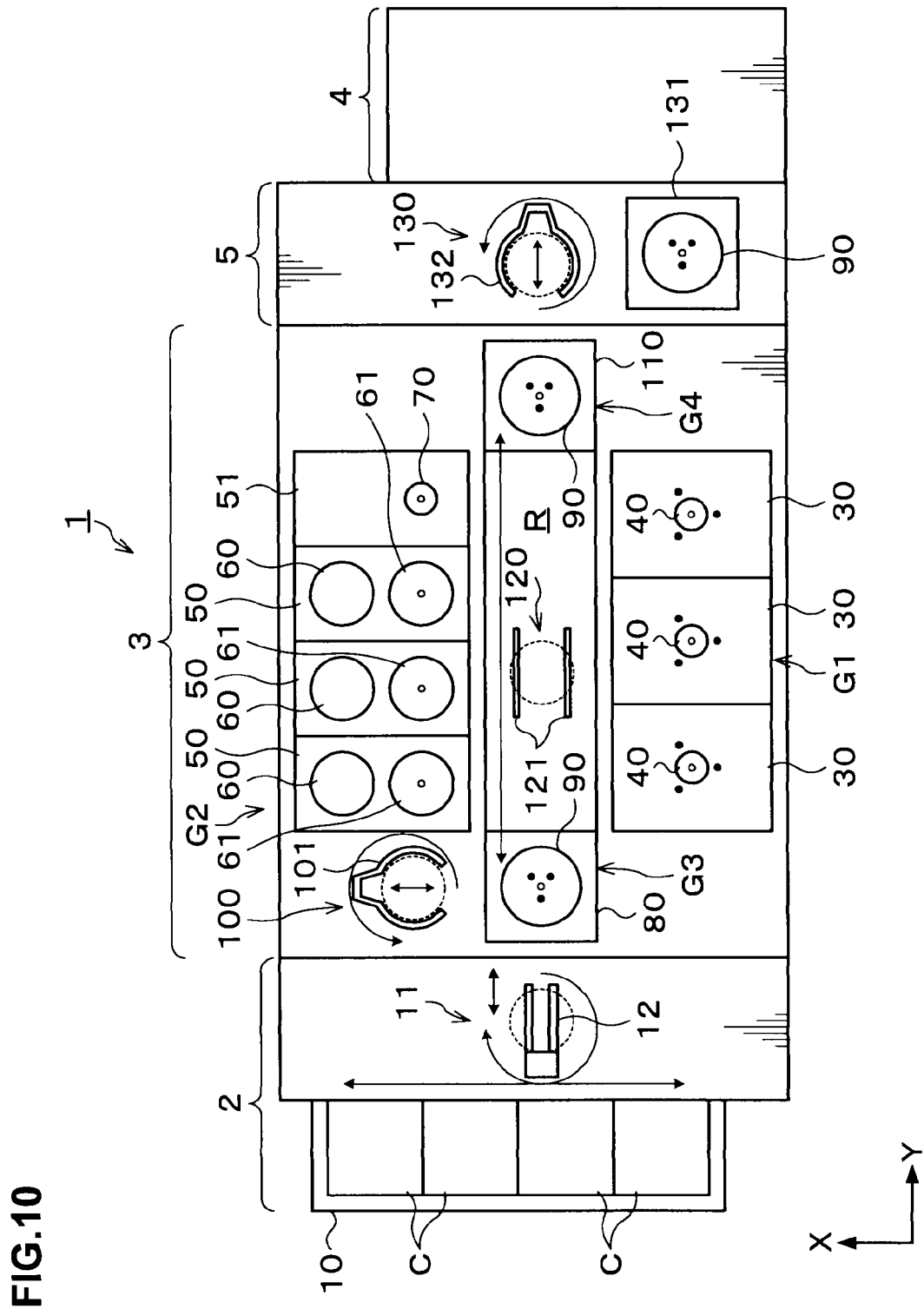
FIG. 10 is an explanatory view showing a configuration of the inside of the coating and developing treatment system.

As shown in FIG. 4 and FIG. 10, a shuttle transfer unit 120 is provided in the wafer transfer region R, which linearly transfers the wafer W between the third block G3 and the fourth block G4.

Figure 11:
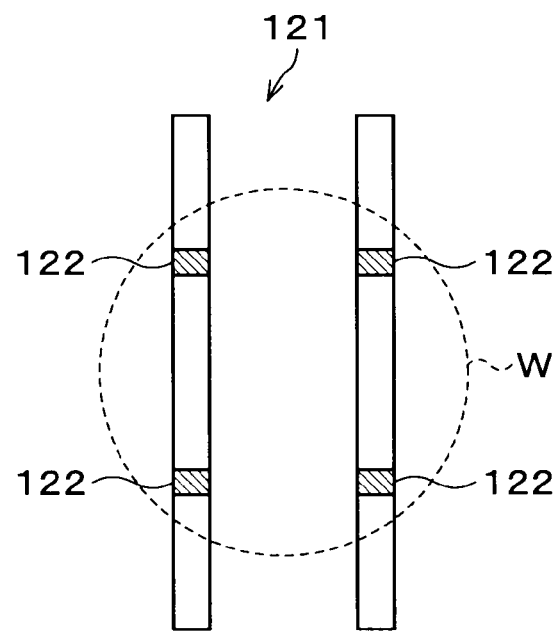
FIG. 11 is an explanatory view showing a configuration of another transfer arm.

The shuttle transfer unit 120 has a transfer arm 121 that is linearly movable in the Y-direction. The transfer arm 121 has, for example, two linear arms as shown in FIG. 11 and can horizontally support the wafer W on support portions 122 of the arms. The transfer arm 121 can move in the Y-direction while supporting the wafer W thereon to transfer the wafer W between the delivery units 80 in the third block G3 and the delivery units 110 in the fourth block G4.

As shown in FIG. 1, in the interface station 5, a wafer transfer unit 130 and a delivery unit 131 are provided. The wafer transfer unit 130 has a transfer arm 132 shown in FIG. 3 having the same configuration as that of the above-described wafer transfer unit 100 and is movable in a front-to-back direction, a $\theta$-direction, and a top-to-bottom direction. The transfer arm 132 can transfer the wafer W to the delivery units 110 in the fourth block G4 and the delivery unit 131 while supporting the wafer W on support potions 22.

The delivery unit 131 has, for example, the same configuration as that of the above-described delivery unit 80 and includes a mounting plate 90 and a plurality of rising/lowering pins 91 as shown in FIG. 9A and FIG. 9B. The rising/lowering pins 91 can receive the wafer W from the transfer arm 132 or a not-shown transfer arm in the aligner 4 and mount it onto the mounting plate 90.

The transfer position of the wafer W by the above transfer arms 12, 21, 101, 121, and 132 is controlled by a control unit 140 shown in FIG. 1 which controls the operations of the transfer arms.

A mounting part A described below indicates one of the above-described spin chuck 40, the cooling plate 61, and chuck 70 and the mounting plate 90.

In the coating and developing treatment system 1 configured as described above, for example, the following wafer processing is performed.

For example, an unprocessed wafer W in the cassette C shown in FIG. 1 is transferred by the transfer arm 12 to the delivery unit 80 in the third block G3 of the processing station 3. The wafer W is then transferred by the transfer arm 21, for example, to the thermal processing unit 50 in the second block G2 and temperature-regulated. The wafer W is then transferred by the transfer arm 21 to the spin-type solution treatment unit 30 in the first block G1, where a lower anti-reflection film is formed on the wafer W. The wafer W is then transferred again by the transfer arm 21 to the thermal processing unit 50 and heated, and then returned to the delivery unit 80.

The wafer W is subsequently transferred by the transfer arm 101 to the delivery unit 80 at another different level in the second block G2. The wafer W is then transferred by the transfer arm 21 to the thermal processing unit 50 and temperature-regulated, and then transferred to the spin-type solution treatment unit 30, where a resist film is formed on the wafer W. The wafer W is then transferred by the transfer arm 21 to the thermal processing unit 50 and heated (prebaking processing), and then returned to the delivery unit 80.

The wafer W is then transferred by the transfer arm 101 to the delivery unit 80 at still another different level. The wafer W is then transferred by the transfer arm 21 to the spin-type solution treatment unit 30, where an upper anti-reflection film is formed on the wafer W. The wafer W is then transferred by the transfer arm 21 to the thermal processing unit 50 and heated, and then returned to the delivery unit 80.

The wafer W is subsequently transferred by the transfer arm 101 to the delivery unit 80 at yet another different level. The wafer W is then transferred by the transfer arm 21, for example, to the edge exposure unit 51, where the resist film at the outer peripheral portion of the wafer W is exposed to light. The wafer W is then returned by the transfer arm 21 to the delivery unit 80.

The wafer W is subsequently transferred by the transfer arm 101 to the delivery unit 80 at another different level, and transferred by the transfer arm 121 to the delivery unit 110 in the fourth block G4. The wafer W is then transferred by the transfer arm 132 in the interface station 5 to the delivery unit 131, then transferred by the not-shown transfer arm in the aligner 4 to the aligner 4 and subjected to exposure processing.

Subsequently, the wafer W is transferred by the transfer arm in the aligner 4 to the delivery unit 131, and transferred by the transfer arm 132 to the delivery unit 110 in the fourth block G4. The wafer W is then transferred by the transfer arm 21 to the thermal processing unit 50 and heated (post exposure-baking processing). The wafer W is then transferred by the transfer arm 21 to the spin-type solution treatment unit 30 and developed. After the development, the wafer W is transferred by the transfer arm 21 to the thermal processing unit 50, and heated (post-baking processing). The wafer W is then transferred by the transfer arm 21 to the delivery unit 80 in the third block G3, and then returned by the transfer arm 12 in the cassette station 2 to the cassette C on the cassette mounting table 10. Thus, wafer processing being a series of photolithography processing ends.

Figure 12:
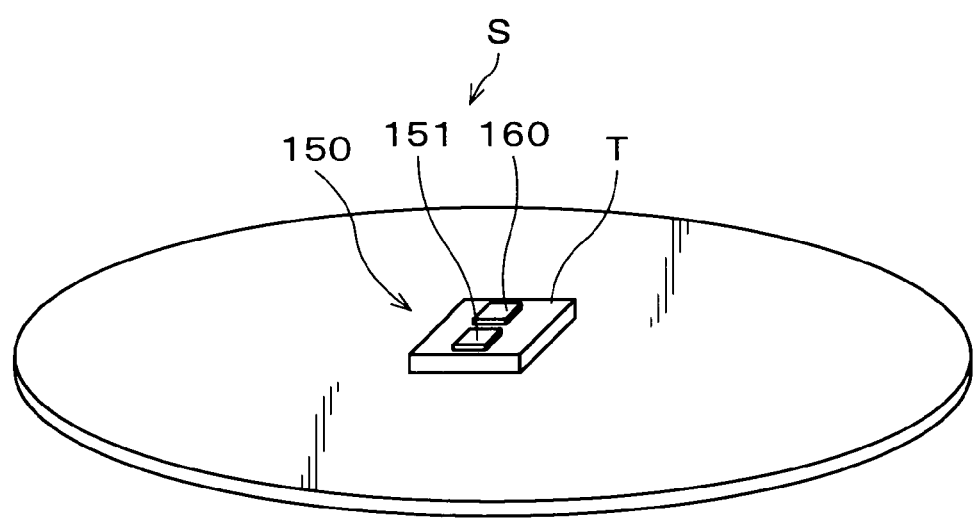
FIG. 12 is a perspective view of a position detecting wafer.

Next, the configuration of the position detecting wafer S as a position detecting jig will be described. FIG. 12 is a perspective view of the position detecting wafer S. The position detecting wafer S is formed to have the same shape and the same size as those of a product wafer W, and can be transferred by the above-described transfer arms, similarly to the wafer W. The position detecting wafer S is formed of ceramics, silicon or resin on which formation of a wiring pattern and hole processing are possible.

Figure 13:
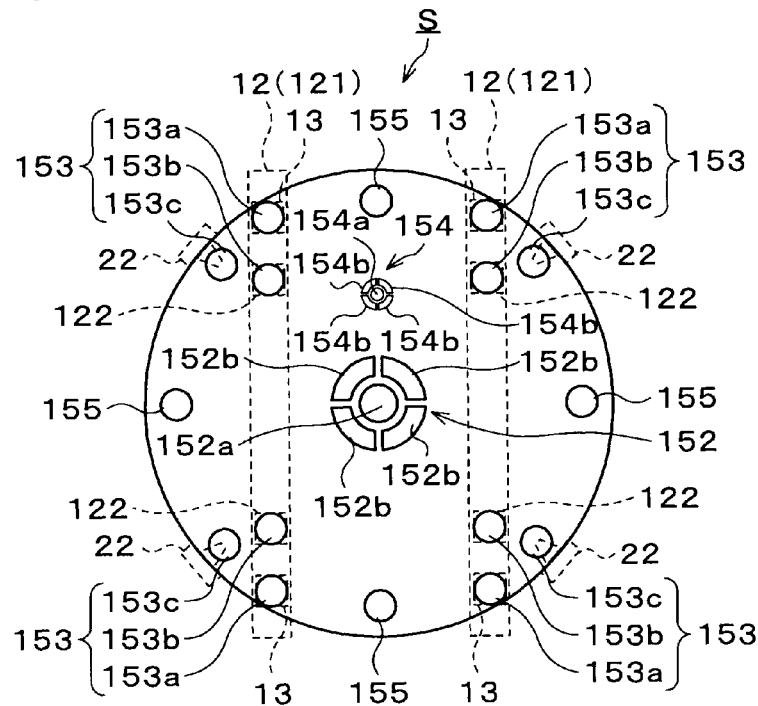
FIG. 13 is an explanatory view showing an arrangement of capacitance detection electrodes on a rear surface of the position detecting wafer.

On the position detecting wafer S, a capacitive sensor 150 which detects the capacitance between the capacitive sensor 150 and a target object is provided. The capacitive sensor 150 has a control circuit 151 on the front surface side and a plurality of capacitance detection electrodes 152, 153, 154, and 155 on the rear surface side as shown in FIG. 13.

For example, the first capacitance detection electrode 152 is provided, for example, at the middle portion on the rear surface of the position detecting wafer S. More specifically, the first capacitance detection electrode 152 is provided at a position corresponding to the center holes 42, 62, 71 and 93 when the position detecting wafer S is mounted on each of the mounting parts A (the spin chuck 40, the cooling plate 61, the chuck 70 and the mounting plate 90). The first capacitance detection electrode 152 has, for example, a central circular portion 152a and four arc portions 152b concentrically surrounding the circular portion 152a. This ensures that the first capacitance detection electrode 152 can detect the capacitance between the first capacitance detection electrode 152 and the upper surface of each of the mounting parts A including the center holes 42, 62, 71 and 93 to detect the relative positional relation of the position detecting wafer S to the center hole 42, 62, 71 or 93 of the mounting part A based on the detected capacitance.

Figure 14:
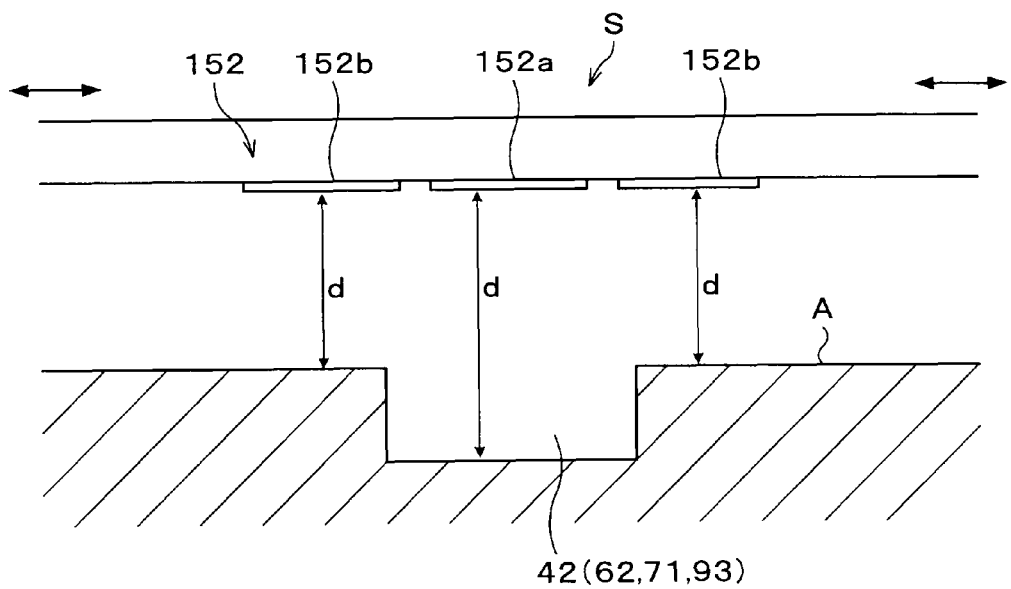
FIG. 14 is an explanatory view showing distances between a first capacitance detection electrode on the position detecting wafer and a front surface of a mounting part.

For example, when the positional relations between the circular portion 152a and the arc portions 152b of the first capacitance detection electrode 152 and the center hole 42, 62, 71 or 93 differ as shown in FIG. 14, a distance d between two points, that is, between each of the electrodes 152a and 152b and the upper surface of the mounting part A including the center hole 42, 62, 71 or 93 varies so that the capacitance varies (capacitance $C = \in *B/d$ ($\in$ is the dielectric constant between two points ($\in = \in_0 \times \in_s$, $\in_0$ is the dielectric constant in vacuum, $\in_s$ is the relative dielectric constant), and B is the area of a capacitance detection electrode).

The above fact is utilized to grasp in advance the relation between the values of the capacitances detected by the central circular portion 152a and the arc portions 152b of the first capacitance detection electrode 152 and the position of the center hole 42, 62, 71 or 93 of the mounting part A at that time, so that the position of the center hole 42, 62, 71 or 93 within the position detecting wafer S in a plan view can be detected based on the detection result of the capacitances by the first capacitance detection electrode 152. This makes it possible to detect the mounting position of the position detecting wafer S on the mounting part A and the position in the horizontal direction of the position detecting wafer S when it has entered a space above the mounting part A. Further, for example, from the capacitance between the circular portion 152a and the center hole 42, 62, 71 or 93, the distance between them can be detected, whereby the position in the vertical direction of the position detecting wafer S when it has entered the space above the mounting part A can also be detected.

Second capacitance detection electrodes 153 shown in FIG. 13 are provided at positions corresponding to the support portions 13, 22 and 122 of the above-described transfer arms. The capacitance between the support portion 13, 22 or 122 and the second capacitance detection electrode 153 varies depending on whether or not the position detecting wafer S is supported on the support portion 13, 22 or 122. Therefore, the second capacitance detection electrode 153 can be used to detect the position in the vertical direction of the position detecting wafer S when delivered to the mounting part A or the rising/lowering pin 41 or 91 of the mounting part A. Note that second capacitance detection electrodes 153a correspond to the support portions 13 of the transfer arm 12, second capacitance detection electrodes 153b correspond to the support portions 122 of the transfer arm 121, and second capacitance detection electrodes 153c correspond to the support portions 22 of the transfer arms 21, 101 and 132 in this embodiment.

A third capacitance detection electrode 154 is provided, for example, at a position corresponding to the rising/lowering pin 41 of the spin chuck 40 and the rising/lowering pin 91 of the mounting plate 90. The third capacitance detection electrode 154 is provided at a position corresponding to, for example, one each of the three rising/lowering pins 41 and 91. The third capacitance detection electrode 154 has, for example, a central circular portion 154a and four arc portions 154b concentrically surrounding the circular portion 154a, similar to the above-described first capacitance detection electrode 152. This ensures that the capacitance between the third capacitance detection electrode 154 and the rising/lowering pin 41 or 91 can be detected when the position detecting wafer S has been moved by each of the transfer arms to above the spin chuck 40 or the mounting plate 90. Thereby, the position of the rising/lowering pin 41 or 91 within the position detecting wafer S, for example, when viewed in a plan view can be detected and, as a result of this, the position in the horizontal direction of the position detecting wafer S when it has entered the space above the mounting part A can be detected. Note that though the third capacitance detection electrode 154 in this embodiment is provided at one location to correspond to one rising/lowering pin, third capacitance detection electrodes 154 may be provided at three locations to correspond to the three rising/lowering pins.

Fourth capacitance detection electrodes 155 are provided, for example, at a plurality of locations of the mounting part A, for example, positions corresponding to target objects at four locations. The fourth capacitance detection electrodes 155 are provided at positions corresponding to a flat surface near the peripheral portion of the mounting part A such as the cooling plate 61 or the like. Further, the fourth capacitance detection electrodes 155 are provided at the peripheral portion of the position detecting wafer S at intervals of 90 degrees. This ensures that the capacitance between the fourth capacitance detection electrode 155 and the flat surface of the mounting part A when the position detecting wafer S has been moved, for example, by the transfer arm 21 to above the mounting part A can be detected to detect the distance between them. This makes it possible to detect the position in the vertical direction of the position detecting wafer S when it has entered the space above the mounting part A. Moreover, the distances at the four locations between the flat surface of the mounting part A and the fourth capacitance detection electrodes 155 are detected and compared with each other, whereby the horizontality of the position detecting wafer S by the transfer arm 21 can be detected.

The above-described capacitance detection electrodes 152 to 155 are electrically connected to a control circuit 151 at the center of the front surface of the position detecting wafer S, for example, via a wiring passing through the position detecting wafer S. The control circuit 151 is formed on a circuit board T provided, for example, at the central portion on the front surface of the position detecting wafer S as shown in FIG. 12. The control circuit 151 can transmit/receive a signal obtained by converting the capacitance detected by each of the capacitance detection electrodes 152 to 155 into a voltage to obtain a capacitance value between each of the capacitance detection electrodes 152 to 155 and the target object. On the circuit board T, a wireless circuit 160 is provided which communicates between the control circuit 151 and the external control unit 140 without wires. Note that the power supply for the capacitance detection electrodes 152 to 155, the control circuit 151, the wireless circuit 160 and so on is provided, for example, on the circuit board T on the position detecting wafer S.

The control unit 140 receives, for example, the detection result of the capacitances by the capacitive sensor 150 from the position detecting wafer S and can calculate, based on the detection result, the mounting position of the position detecting wafer S on the mounting part A and the position in the vertical direction and in the horizontal direction above the mounting part A. Based on the calculation result, the control unit 140 can calculate a correction amount to an appropriate position of the position detecting wafer S and adjust the moving position of each of the transfer arms when transferring the wafer.

Next, a process of adjusting the moving position of each of the transfer arms using the position detecting wafer S configured as described above will be described.

First, the adjustment of the moving position of the transfer arm 12 when transferring the wafer W to the delivery unit 80 will be described.

First, the position detecting wafer S is supported on the support portions 13 of the transfer arm 12. Note that the second capacitance detection electrode 153a at the position corresponding to the support portion 13 may be used to detect whether or not the position detecting wafer S is appropriately supported on the support portion 13. More specifically, the capacitance between the second capacitance detection electrode 153a and the support portion 13 may be detected, and when the capacitance does not indicate the previously set capacitance, it may be judged that the position detecting wafer S is not appropriately supported on the support portion 13.

Figure 15A:
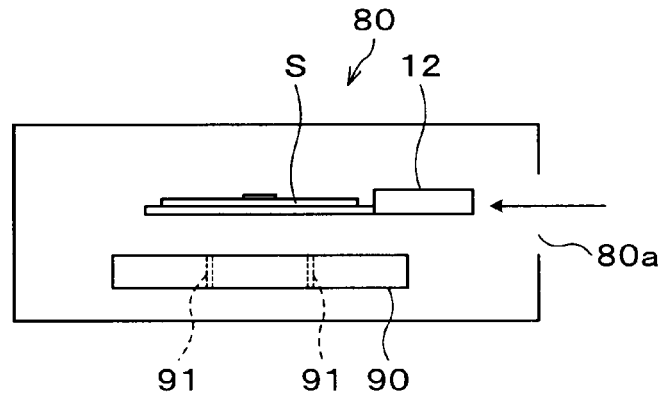
FIG. 15A is an explanatory view showing an appearance in which the transfer arm has entered a space above the mounting plate in the delivery unit.

Next, according to the present setting of the moving position at wafer transfer in the control unit 140, the transfer arm 12 enters the delivery unit 80 in the third block G3 through a transfer port 80a and stops above the mounting plate 90 that is the transfer destination as shown in FIG. 15A. Note that, at this point in time, the rising/lowering pins 91 have lowered to avoid collision between the transfer arm 12 and the rising/lowering pins 91. Thereafter, at the position above the mounting plate 90, the fourth capacitance detection electrode 155 detects the distance to the mounting plate 90. This allows for detection of the position in the vertical direction (height) of the transfer arm 12 when it has entered the space above the mounting plate 90 at a design value. For example, if the height of the transfer arm 12 at entry is not appropriate, the control unit 140 adjusts the entry height of the transfer arm 12.

Subsequently, the fourth capacitance detection electrodes 155 at four locations are used to detect the distances between the fourth capacitance detection electrodes 155 and the front surface of the mounting plates 90. By comparing the these distances at four locations between the fourth capacitance detection electrodes 155 and the mounting plate 90, the horizontal degree of the mounting plate 90 is detected. For example, when the mounting plate 90 is not horizontal, the height adjustment of an attach portion of the mounting plate 90 is performed.

Figure 15B:
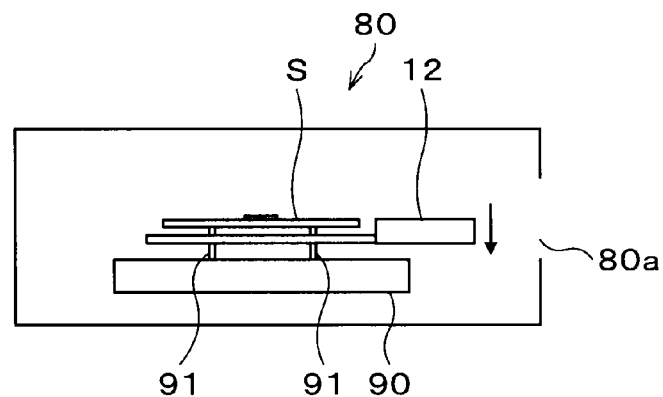
FIG. 15B is an explanatory view showing an appearance in which the position detecting wafer has been transferred to rising/lowering pins.

The rising/lowering pins 91 then rise to a predetermined height, for example, as shown in FIG. 15B, and the transfer arm 12 then lowers by a predetermined distance to deliver the position detecting wafer S to the rising/lowering pins 91. In this event, the second capacitance detection electrode 153a detects a position (an OFF point) at a moment when the position detecting wafer S is separated from the support portion 13 of the transfer arm 12. Thereafter, the transfer arm 12 rises, whereby the position detecting wafer S is delivered from the rising/lowering pins 91 onto the transfer arm 12 (the state in FIG. 15A). In this event, the second capacitance detection electrode 153a detects a position (an ON point) at a moment when the position detecting wafer S is supported on the support portion 13 of the transfer arm 12. By detecting the OFF point and the ON point, the delivery position by the transfer arm 12 in the vertical direction between the position detecting wafer S and the rising/lowering pins 91 is detected. For example, when the delivery position is not appropriate, the entry height of the transfer arm 12 to above the mounting plate 90 and the lowering distance of the transfer arm 12 at the time of delivery to the rising/lowering pins 91 and so on are corrected in the control unit 140.

Figure 15C:
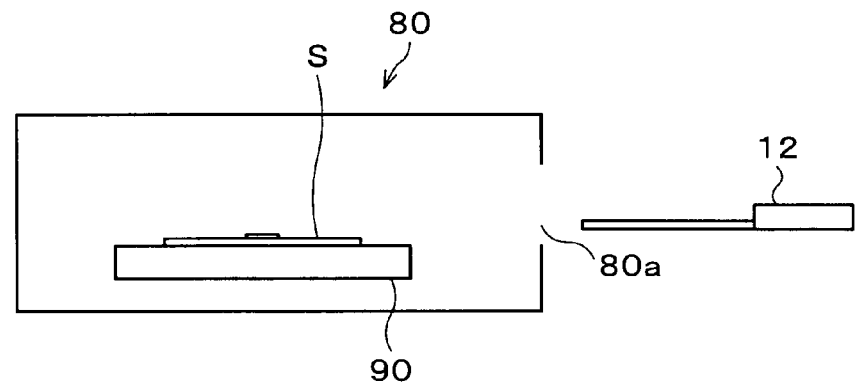
FIG. 15C is an explanatory view showing an appearance in which the position detecting wafer has been mounted on the mounting plate.

Then, the position of the rising/lowering pin 91 within the position detecting wafer S is detected by the third capacitance detection electrode 154 on the position detecting wafer S with the position detecting wafer S kept waiting above the rising/lowering pins 91 as shown in FIG. 15A. Whether or not the rising/lowering pin 91 is located at a position corresponding to the third capacitance detection electrode 154, or its relative position is detected. This can verify a rough position in the horizontal direction of the position detecting wafer S above the mounting plate 90. Once it is verified that the position detecting wafer S is located at a roughly appropriate position above the mounting plate 90, the transfer arm 12 lowers to deliver the position detecting wafer S to the rising/lowering pins 91, and the rising/lowering pins 91 then lower to mount the position detecting wafer S onto the mounting plate 90 as shown in FIG. 15C. If the position detecting wafer S is not located at an appropriate position above the mounting plate 90, the position in the horizontal direction of the transfer arm 12 is adjusted at this point in time.

Figure 16:
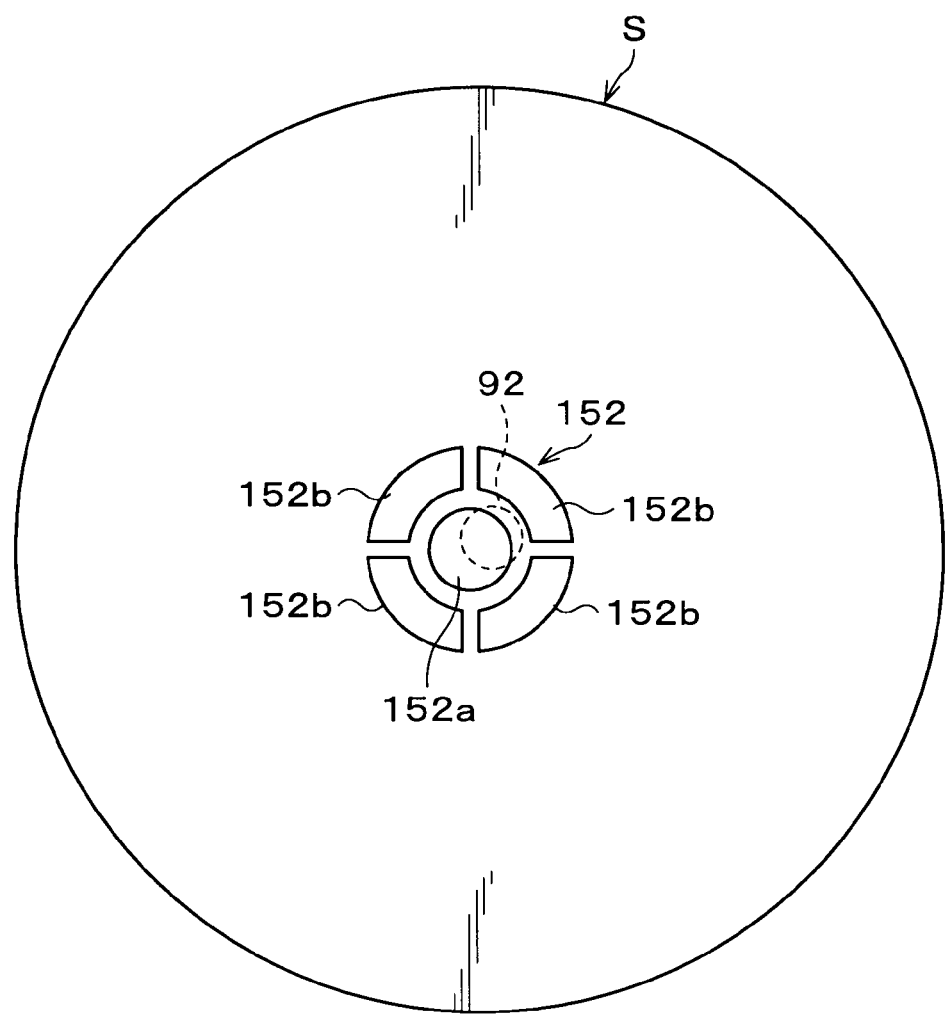
FIG. 16 is an explanatory view showing a position of a center hole within the position detecting wafer.

Once the position detecting wafer S is mounted on the mounting plate 90, the capacitance between the first capacitance detection electrode 152 and the upper surface of the mounting plate 90 including the center hole 92 is detected. Thereby, the relative positional relation of the center hole 92 of the mounting plate 90 within the position detecting wafer S when viewed in a plan view as shown in FIG. 16 is detected, so that the mounting position of the position detecting wafer S on the mounting plate 90 is detected. If the mounting position of the position detecting wafer S is displaced from the center of the mounting plate 90, the displacement amount is calculated and the moving position of the transfer arm 12 when transferring is adjusted.

Thus, the position adjustment of the transfer arm 12 when the wafer W is delivered by the transfer arm 12 to the mounting plate 90 is performed.

Next, the adjustment of the moving position of the transfer arm 21 will be described. The adjustment of the moving position of the transfer arm 21 when transferring the wafer W to the spin chuck 40 of the spin-type solution treatment unit 30 will be described first.

First of all, the position detecting wafer S is supported on the support portions 22 of the transfer arm 21. Note that the second capacitance detection electrode 153c at the position corresponding to the support portion 22 may be used to detect whether or not the position detecting wafer S is appropriately supported on the support portion 22.

Figure 17A:
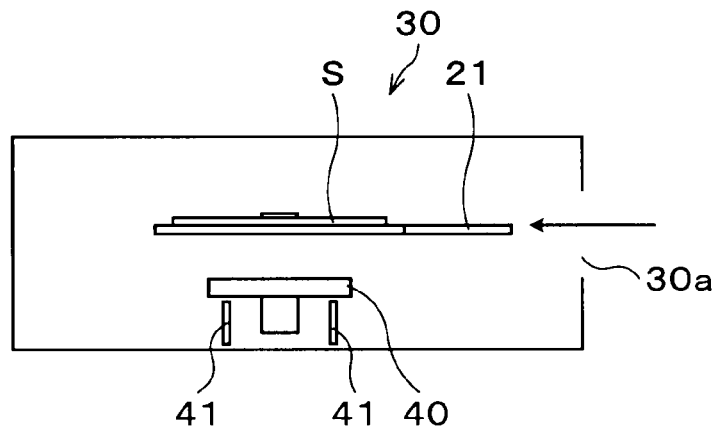
FIG. 17A is an explanatory view showing an appearance in which the transfer arm has entered a space above a spin chuck in the spin-type solution treatment unit.

Then, according to the present setting of the moving position at wafer transfer in the control unit 140, the transfer arm 21 enters the spin-type solution treatment unit 30 in the first block G1 through a transfer port 30a and stops above the spin chuck 40 that is the transfer destination as shown in FIG. 17A. Thereafter, for example, at the position above the spin chuck 40, the fourth capacitance detection electrode 155 detects the distance to the front surface of the spin chuck 40. This allows for detection of the height of the transfer arm 21 when it has entered the space above the spin chuck 40 at a design value. For example, if the height of the transfer arm 21 at entry is not appropriate, the control unit 140 adjusts the entry height of the transfer arm 21.

Subsequently, the fourth capacitance detection electrodes 155 at four locations are used to detect the distances between the fourth capacitance detection electrodes 155 and the front surface of the spin chuck 40. By comparing the these distances at four locations between the fourth capacitance detection electrodes 155 and the spin chuck 40, the horizontal degree of the spin chuck 40 is detected. For example, when the spin chuck 40 is not horizontal, the height adjustment of an attach portion of the spin chuck 40 is performed.

Figure 17B:
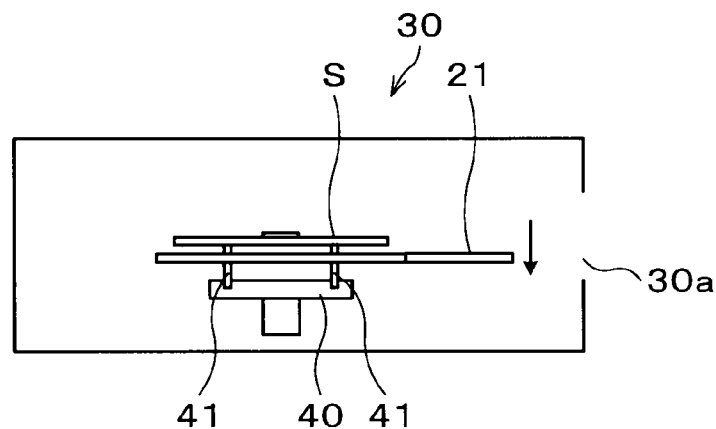
FIG. 17B is an explanatory view showing an appearance in which the position detecting wafer has been transferred to rising/lowering pins.

The rising/lowering pins 41 then rise to a predetermined height, for example, as shown in FIG. 17B, and the transfer arm 21 then lowers by a predetermined distance to deliver the position detecting wafer S to the rising/lowering pins 41. In this event, the second capacitance detection electrode 153c detects a position (an OFF point) at a moment when the position detecting wafer S is separated from the support portion 22 of the transfer arm 21. Thereafter, the transfer arm 21 rises, whereby the position detecting wafer S is delivered from the rising/lowering pins 41 onto the transfer arm 21 (the state in FIG. 17A). In this event, the second capacitance detection electrode 153c detects a position (an ON point) at a moment when the position detecting wafer S is supported on the support portion 22 of the transfer arm 21. By detecting the OFF point and the ON point, the delivery position by the transfer arm 21 in the vertical direction between the position detecting wafer S and the rising/lowering pins 41 is detected. For example, when the delivery position is not appropriate, the entry height of the transfer arm 21 to above the spin chuck 40 and the lowering distance of the transfer arm 21 at the time of delivery to the rising/lowering pins 41 and so on are made appropriate in the control unit 140.

Figure 17C:
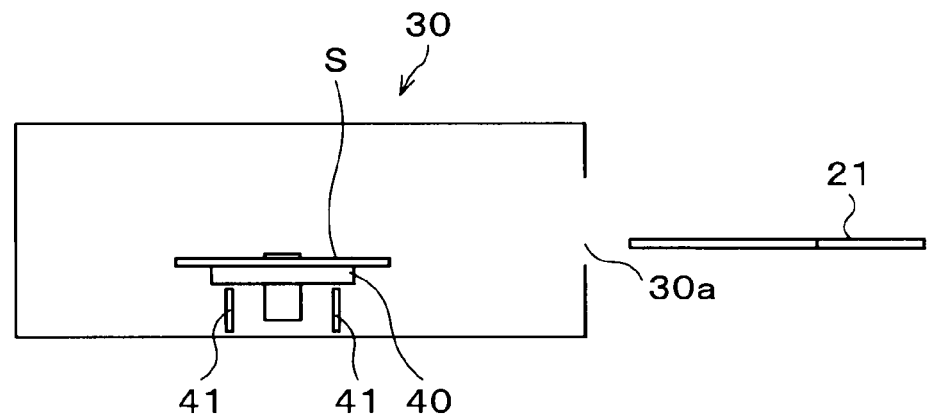
FIG. 17C is an explanatory view showing an appearance in which the position detecting wafer has been mounted on the spin chuck.

Then, the position of the rising/lowering pin 41 within the position detecting wafer S is detected by the third capacitance detection electrode 154 on the position detecting wafer S with the position detecting wafer S kept waiting above the rising/lowering pins 41 as shown in FIG. 17A. This can verify a rough position in the horizontal direction of the position detecting wafer S above the spin chuck 40. Once it is verified that the position detecting wafer S is located at a roughly appropriate position above the spin chuck 40, the transfer arm 21 lowers to deliver the position detecting wafer S to the rising/lowering pins 41, and the rising/lowering pins 41 then lower to mount the position detecting wafer S onto the spin chuck 40 as shown in FIG. 17C. Note that if the position detecting wafer S is not located at an appropriate position above the spin chuck 40, the position in the horizontal direction of the transfer arm 21 is adjusted at this point in time.

Once the position detecting wafer S is mounted on the spin chuck 40, the first capacitance detection electrode 152 detects the capacitance between the first capacitance detection electrode 152 and the upper surface of the spin chuck 40 including the center hole 42. Thereby, the relative positional relation between the position detecting wafer S and the center hole 42 is detected, so that the mounting position of the position detecting wafer S on the spin chuck 40 is detected. If the mounting position of the position detecting wafer S is not appropriate, the moving position of the transfer arm 21 when transferring is adjusted. The position adjustment is performed using, as a correction amount, a displacement amount between the center of the position detecting wafer S and the center hole 42 of the spin chuck 40 calculated, for example, by the control unit 140.

Thus, the position adjustment of the transfer arm 21 when the wafer W is delivered to the spin chuck 40 is performed.

Next, the position adjustment of the transfer arm 21 when transferring the wafer W to the cooling plate 61 in the thermal processing unit 50 will be described.

Figure 18A:
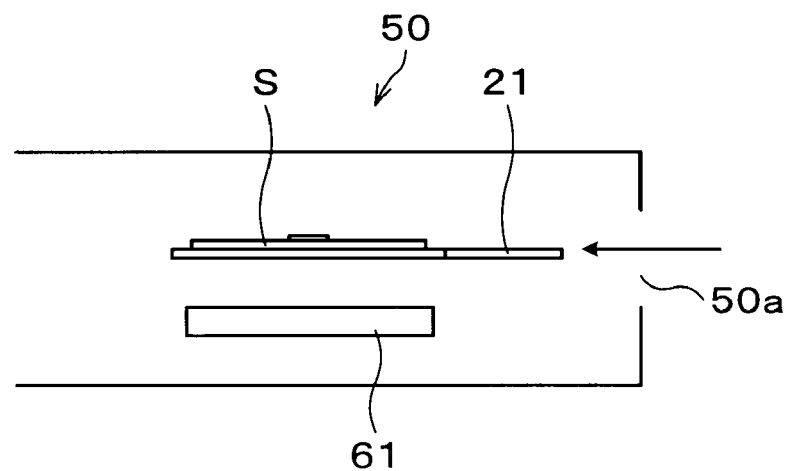
FIG. 18A is an explanatory view showing an appearance in which the transfer arm has entered a space above a cooling plate in the thermal processing unit.

First of all, the position detecting wafer S is supported on the support portions 22 of the transfer arm 21. Then, according to the present position setting of the transfer destination in the control unit 140, the transfer arm 21 enters the thermal processing unit 50 in the second block G2 through a transfer port 50a and stops above the cooling plate 61 that is the transfer destination as shown in FIG. 18A. At the position above the cooling plate 61, the fourth capacitance detection electrode 155 detects the distance to the front surface of the cooling plate 61 shown in FIG. 7. This allows for detection of the height of the transfer arm 21 when it has entered the space above the cooling plate 61 at a design value. For example, if the height of the transfer arm 21 at entry is not appropriate, the control unit 140 adjusts the entry height of the transfer arm 21.

Subsequently, the fourth capacitance detection electrodes 155 at four locations are used to detect the distances between the fourth capacitance detection electrodes 155 and the front surface of the cooling plate 61. By comparing these distances at four locations between the fourth capacitance detection electrodes 155 and the cooling plate 61, the horizontal degree of the cooling plate 61 is detected. For example, when the cooling plate 61 is not horizontal, the height adjustment of an attach portion of the cooling plate 61 is performed.

Figure 18B:
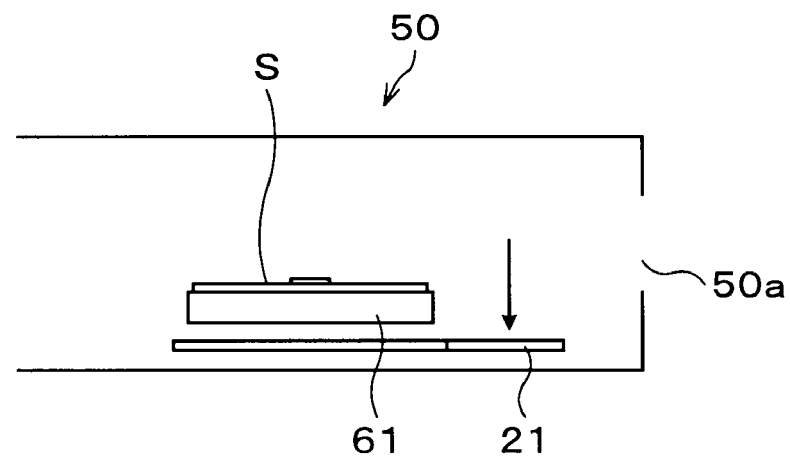
FIG. 18B is an explanatory view showing an appearance in which the position detecting wafer has been mounted on the cooling plate.

Then, the position of the center hole 62 of the cooling plate 61 within the position detecting wafer S is detected, for example, by the first capacitance detection electrode 152, for example, with the transfer arm 21 kept waiting above the cooling plate 61 as shown in FIG. 18A. This can verify a rough position in the horizontal direction of the position detecting wafer S above the cooling plate 61. Once it is verified that the position detecting wafer S is located at a roughly appropriate position above the cooling plate 61, the transfer arm 21 lowers to deliver the position detecting wafer S to the cooling plate 61 as shown in FIG. 18B. Note that if the position detecting wafer S is not located at an appropriate position above the cooling plate 61, the position in the horizontal direction of the transfer arm 21 is adjusted at this point in time.

Once the position detecting wafer S is mounted on the cooling plate 61, the first capacitance detection electrode 152 detects the capacitance between the first capacitance detection electrode 152 and the upper surface of the cooling plate 61 including the center hole 62. Thereby, the relative positional relation between the position detecting wafer S and the center hole 62 of the cooling plate 61 is detected, so that the mounting position of the position detecting wafer S on the cooling plate 61 is detected. If the mounting position of the position detecting wafer S is not appropriate, the moving position of the transfer arm 21 when transferring is adjusted. The position adjustment is performed using, as a correction amount, a displacement amount between the center of the position detecting wafer S and the center hole 62 calculated, for example, by the control unit 140.

Thus, the position adjustment of the transfer arm 21 when the wafer W is delivered to the cooling plate 61 is performed.

Next, the position adjustment of the transfer arm 21 when transferring the wafer W to the chuck 70 in the edge exposure unit 51 will be described.

Figure 19A:
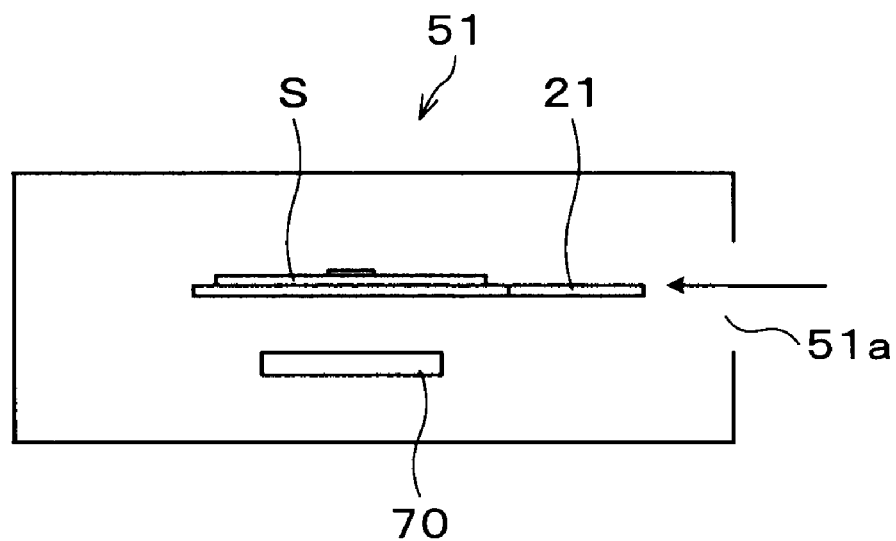
FIG. 19A is an explanatory view showing an appearance in which the transfer arm has entered a space above a chuck in the edge exposure unit.

First of all, the position detecting wafer S is supported on the support portions 22 of the transfer arm 21. Then, according to the present position setting of the transfer destination in the control unit 140, the transfer arm 21 enters the edge exposure unit 51 in the second block G2 through a transfer port 51a and stops above the chuck 70 that is the transfer destination as shown in FIG. 19A. At the position above the chuck 70, the fourth capacitance detection electrode 155 then detects the distance to the front surface of the chuck 70. This allows for detection of the height of the transfer arm 21 when it has entered the space above the chuck 70 at a design value. For example, if the height of the transfer arm 21 at entry is not appropriate, the control unit 140 adjusts the entry height of the transfer arm 21.

Subsequently, the fourth capacitance detection electrodes 155 at four locations are used to detect the distances between the fourth capacitance detection electrodes 155 and the front surface of the chuck 70. By comparing these distances at four locations between the fourth capacitance detection electrodes 155 and the chuck 70, the horizontal degree of the chuck 70 is detected. For example, when the chuck 70 is not horizontal, the height adjustment of an attach portion of the chuck 70 is performed.

Figure 19B:
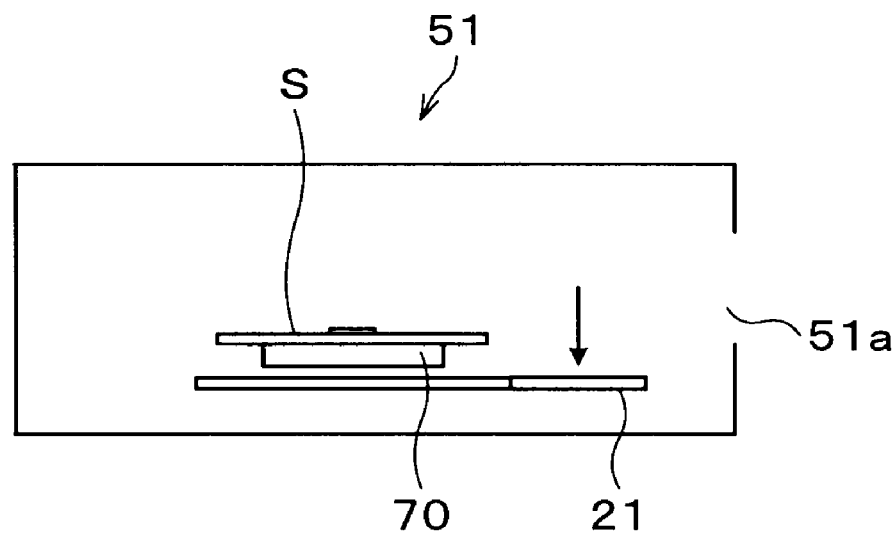
FIG. 19B is an explanatory view showing an appearance in which the position detecting wafer has been mounted on the chuck.

The transfer arm 21 then lowers to deliver the position detecting wafer S onto the chuck 70, for example, as shown in FIG. 19B. In this event, the second capacitance detection electrode 153c detects a position (an OFF point) at a moment when the position detecting wafer S is separated from the support portion 22 of the transfer arm 21. Thereafter, the transfer arm 21 rises, whereby the position detecting wafer S is delivered from the chuck 70 again to the transfer arm 21 (the state in FIG. 19A). In this event, the second capacitance detection electrode 153c detects a position (an ON point) at a moment when the position detecting wafer S is supported on the support portion 22 of the transfer arm 21. By detecting the OFF point and the ON point, the delivery position by the transfer arm 21 in the vertical direction between the position detecting wafer S and the chuck 70 is detected. For example, when the delivery position is not appropriate, the entry height of the transfer arm 21 to above the chuck 70 and so on are corrected in the control unit 140.

Once the position detecting wafer S is mounted again on the chuck 70 as shown in FIG. 19B, the first capacitance detection electrode 152 detects the capacitance between the first capacitance detection electrode 152 and the upper surface of the chuck 70 including the center hole 71. Thereby, the relative positional relation between the position detecting wafer S and the center hole 71 of the chuck 70 is detected, so that the mounting position of the position detecting wafer S on the chuck 70 is detected. If the mounting position of the position detecting wafer S is not appropriate, the moving position of the transfer arm 21 when transferring is adjusted. The position adjustment is performed using, as a correction amount, a displacement amount between the center of the position detecting wafer S and the center hole 71 of the chuck 70 calculated, for example, by the control unit 140.

Thus, the position adjustment of the transfer arm 21 when the wafer W is delivered to the chuck 70 is performed.

Next, the position adjustment of the transfer arm 21 when transferring the wafer W to the mounting plates 90 in the delivery units 80 and 110 will be described.

Figure 20A:
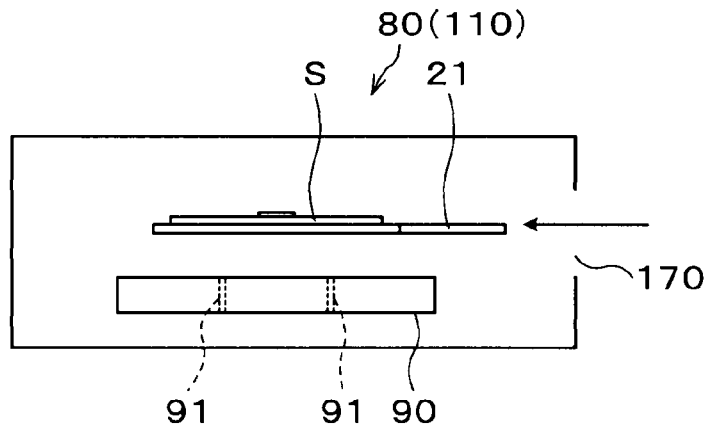
FIG. 20A is an explanatory view showing an appearance in which the transfer arm has entered a space above the mounting plate in the delivery unit.

First of all, the position detecting wafer S is supported on the support portions 22 of the transfer arm 21. Then, according to the present setting of the moving position at wafer transfer in the control unit 140, the transfer arm 21 enters the delivery unit 80 in the third block G3 or the delivery unit 110 in the fourth block G4 through a transfer port 170 and stops above the mounting plate 90 that is the transfer destination as shown in FIG. 20A. Thereafter, for example, at the position above the mounting plate 90, the fourth capacitance detection electrode 155 detects the distance to the mounting plate 90. This allows for detection of the position in the vertical direction of the transfer arm 21 when it has entered the space above the mounting plate 90. For example, if the height in the vertical direction of the transfer arm 21 at entry is not appropriate, the control unit 140 adjusts the entry height of the transfer arm 21.

Subsequently, the fourth capacitance detection electrodes 155 at four locations are used to detect the distances between the fourth capacitance detection electrodes 155 and the front surface of mounting plate 90. By comparing these distances at four locations between the fourth capacitance detection electrodes 155 and the front surface of the mounting plate 90, the horizontal degree of the mounting plate 90 is detected. For example, when the mounting plate 90 is not horizontal, the height adjustment of an attach portion of the mounting plate 90 is performed.

Figure 20B:
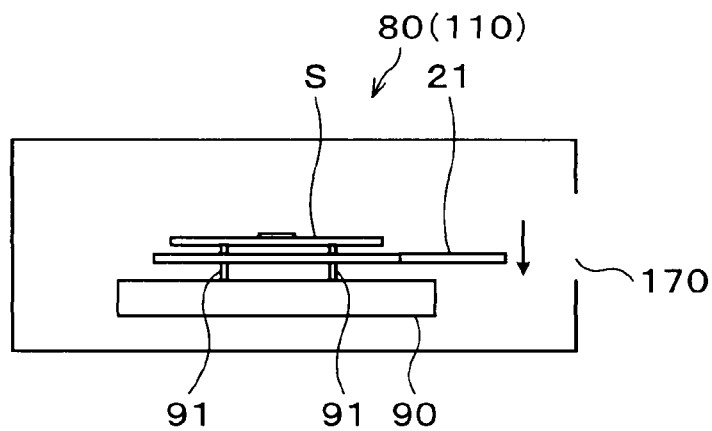
FIG. 20B is an explanatory view showing an appearance in which the position detecting wafer has been transferred to rising/lowering pins.

The rising/lowering pins 91 then rise to a predetermined height, for example, as shown in FIG. 20B, and the transfer arm 21 then lowers by a predetermined distance to deliver the position detecting wafer S to the rising/lowering pins 91. In this event, the second capacitance detection electrode 153c detects a position (an OFF point) at a moment when the position detecting wafer S is separated from the support portion 22 of the transfer arm 21. Thereafter, the transfer arm 21 rises, whereby the position detecting wafer S is delivered from the rising/lowering pins 91 again onto the transfer arm 21 (the state in FIG. 20A). In this event, the second capacitance detection electrode 153c detects a position (an ON point) at a moment when the position detecting wafer S is supported on the support portion 22 of the transfer arm 21. By detecting the OFF point and the ON point, the delivery position by the transfer arm 21 in the vertical direction between the position detecting wafer S and the rising/lowering pins 91 is detected. For example, when the delivery position is not appropriate, the entry height of the transfer arm 21 to above the mounting plate 90 and the lowering distance of the transfer arm 21 at the time of delivery to the rising/lowering pins 91 and so on are corrected in the control unit 140.

Figure 20C:
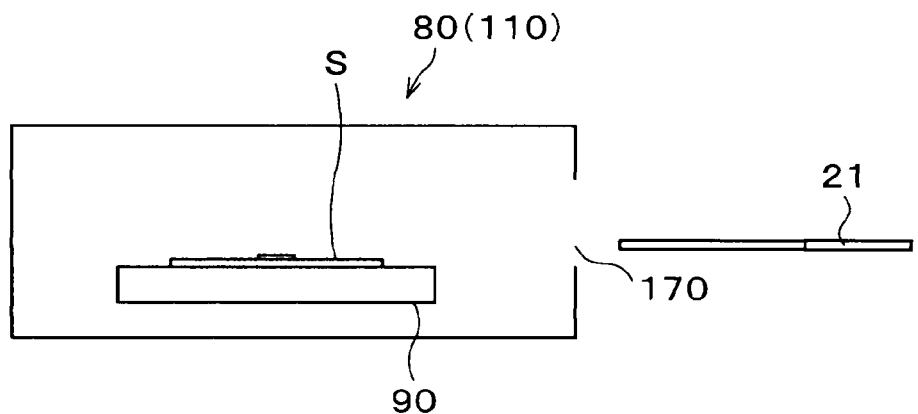
FIG. 20C is an explanatory view showing an appearance in which the position detecting wafer has been mounted on the mounting plate.

Then, the position of the rising/lowering pin 91 is detected by the third capacitance detection electrode 154 on the position detecting wafer S with the position detecting wafer S kept waiting above the rising/lowering pins 91 as shown in FIG. 20A. This can verify a rough position in the horizontal direction of the position detecting wafer S above the mounting plate 90. Once it is verified that the position detecting wafer S is located at a roughly appropriate position above the mounting plate 90, the transfer arm 21 lowers to deliver the position detecting wafer S to the rising/lowering pins 91, and the rising/lowering pins 91 then lower to mount the position detecting wafer S onto the mounting plate 90 as shown in FIG. 20C. Note that if the position detecting wafer S is not located at an appropriate position above the mounting plate 90, the position in the horizontal direction of the transfer arm 21 is adjusted at this point in time.

Once the position detecting wafer S is mounted on the mounting plate 90, the first capacitance detection electrode 152 detects the capacitance between the first capacitance detection electrode 152 and the upper surface of the mounting plate 90 including the center hole 92. Thereby, the relative positional relation between the position detecting wafer S and the center hole 92, so that the mounting position of the position detecting wafer S on the mounting plate 90 is detected. If the mounting position of the position detecting wafer S is not appropriate, the position of the transfer destination by the transfer arm 21 is adjusted. The position adjustment is performed using, as a correction amount, a displacement amount between the center of the position detecting wafer S and the center hole 92 of the mounting plate 90 calculated, for example, by the control unit 140.

Thus, the position adjustment of the transfer arm 21 when the wafer W is delivered to the mounting plate 90 is performed.

Next, the position adjustment of the transfer arm 101 when transferring the wafer W to the mounting plate 90 in the third block G3 will be described. The position adjustment of the transfer arm 101 is the same as the position adjustment of the transfer arms 12 and 21 to the mounting plate 90.

More specifically, first of all, the position detecting wafer S is supported on the support portions 22 of the transfer arm 101. Then, the transfer arm 101 enters the delivery unit 80 in the third block G3 and stops above the mounting plate 90 that is the transfer destination. Thereafter, for example, at the position above the mounting plate 90, the fourth capacitance detection electrode 155 detects the distance to the mounting plate 90, so that the position in the vertical direction of the transfer arm 101 when it has entered the space above the mounting plate 90 is detected. If the position in the vertical direction of the transfer arm 101 at entry is not appropriate, the control unit 140 adjusts the entry height of the transfer arm 101.

Subsequently, the fourth capacitance detection electrodes 155 at four locations are used to detect the distances between the fourth capacitance detection electrodes 155 and the front surface of the mounting plate 90. By comparing these distances at four locations between the fourth capacitance detection electrodes 155 and the mounting plate 90, the horizontal degree of the mounting plate 90 is detected. For example, when the mounting plate 90 is not horizontal, the height adjustment of an attach portion of the mounting plate 90 is performed.

The rising/lowering pins 91 then rise, for example, to a predetermined height and the transfer arm 101 then lowers by a predetermined distance to deliver the position detecting wafer S to the rising/lowering pins 91. In this event, the second capacitance detection electrode 153c detects a position (an OFF point) at a moment when the position detecting wafer S is separated from the support portion 22 of the transfer arm 101. Thereafter, the transfer arm 101 rises, whereby the position detecting wafer S is delivered from the rising/lowering pins 91 again onto the transfer arm 101. In this event, the second capacitance detection electrode 153c detects a position (an ON point) at a moment when the position detecting wafer S is supported on the support portion 22 of the transfer arm 101. By detecting the OFF point and the ON point, the delivery position by the transfer arm 101 in the vertical direction between the position detecting wafer S and the rising/lowering pins 91 is detected. For example, when the delivery position is not appropriate, the entry height of the transfer arm 101 to above the mounting plate 90, the lowering distance of the transfer arm 101 at the time of delivery to the rising/lowering pins 91, the position in the vertical direction of the rising/lowering pins 91 and so on are corrected in the control unit 140.

Then, the position of the rising/lowering pin 91 is detected by the third capacitance detection electrode 154 on the position detecting wafer S with the position detecting wafer S kept waiting above the rising/lowering pins 91. This can verify a rough position in the horizontal direction of the position detecting wafer S above the mounting plate 90. Once it is verified that the position detecting wafer S is located at a roughly appropriate position above the mounting plate 90, the transfer arm 101 lowers to deliver the position detecting wafer S to the rising/lowering pins 91, and the rising/lowering pins 91 then lower to mount the position detecting wafer S onto the mounting plate 90. Note that if the position detecting wafer S is not located at an appropriate position above the mounting plate 90, the position in the horizontal direction of the transfer arm 101 is adjusted at this point in time.

Once the position detecting wafer S is mounted on the mounting plate 90, the first capacitance detection electrode 152 detects the capacitance between the first capacitance detection electrode 152 and the upper surface of the mounting plate 90 including the center hole 92. Thereby, the relative positional relation between the position detecting wafer S and the center hole 92 is detected, so that the mounting position of the position detecting wafer S on the mounting plate 90 is detected. If the mounting position of the position detecting wafer S is not appropriate, the moving position of the transfer arm 101 when transferring is adjusted. The position adjustment is performed using, as a correction amount, a displacement amount between the center of the position detecting wafer S and the center hole 92 of the mounting plate 90 calculated, for example, by the control unit 140.

Thus, the position adjustment of the transfer arm 101 when the wafer W is delivered to the mounting plate 90 is performed.

Note that the position adjustment of the transfer arm 121 when transferring the wafer W to the mounting plates 90 in the delivery units 80 and 110 is the same as those of the above-described transfer arms 12, 21 and 101 except that only the arm shape is different, and therefore description will be omitted. Further, the position adjustment of the transfer arm 132 when transferring the wafer W to the mounting plates 90 in the delivery units 110 and 131 is the same as those of the above-described transfer arms 12, 21 and 101, and therefore description will be omitted.

According to the above embodiment, the position detecting wafer S having the capacitive sensor 150 is supported by the transfer arm (12, 21, 101, 121, 132) and transferred by the transfer arm to the mounting part A in each of the units, and the mounting position of the position detecting wafer S is detected by the capacitive sensor 150. Based on the mounting position, the position adjustment of the transfer arm is performed. The capacitive sensor 150 can be formed much thinner than the conventional optical sensor, so that the position detecting wafer S can be made thin. Accordingly, the position detecting wafer S can be transferred also to a low-profile unit having a narrow transfer port, and the adjustment of the moving position of the transfer arm can be appropriately performed. The use of the position detecting wafer S having the capacitive sensor 150 allows for position adjustment of the transfer arm with a high accuracy and at a low cost.

In the above embodiment, as in the case of the cooling plate 61, for example, when the position detecting wafer S is directly mounted onto the mounting part A from the transfer arm, the first capacitance detection electrode 152 detects the position of the center hole of the mounting part A to detect the position in the horizontal direction of the position detecting wafer S above the mounting part A before the position detecting wafer S is lowered. This ensures that the rough position of the position detecting wafer S before mounted on the mounting part A can be detected, so that if the position in the horizontal direction of the position detecting wafer S is greatly displaced, for example, the position adjustment of the transfer arm can be performed at this point in time. Therefore, it can be prevented that the position detecting wafer S is lowered in a greatly displaced state and, for example, the transfer arm comes into contact with the mounting part A.

Further, for example, when the position detecting wafer S is mounted from the transfer arm onto the mounting part A via the rising/lowering pins as in the case of the mounting plate 90 and the spin chuck 40, the position of the rising/lowering pin of the mounting part A is detected by the third capacitance detection electrode 154 to detect the position in the horizontal direction of the position detecting wafer S above the mounting part A before the position detecting wafer S is lowered. This ensures that the rough position of the position detecting wafer S before mounted on the mounting part A can be detected so that, for example, if the position in the horizontal direction of the position detecting wafer S is greatly displaced, the position adjustment of the transfer arm can be performed at this point in time. Therefore, it can be prevented that the position detecting wafer S is lowered in a greatly displaced state and, for example, the transfer arm comes into contact with the mounting part A.

In the above embodiment, for example, when the position detecting wafer S is directly mounted onto the mounting part A from the transfer arm as in the case of the cooling plate 61 and the chuck 70, the second capacitance detection electrode 153 on the position detecting wafer S detects a variation in distance to the support portion of the transfer arm to detect the position in the vertical direction of delivery of the position detecting wafer S between the transfer arm and the mounting part A. This allows for adjustment of the lowering position and the lowering distance of the transfer arm at the time of delivery. For example, if the transfer arm 21 starts to lower from a position higher than necessary or lowers to a position lower than necessary with respect to the actual delivery position of the position detecting wafer S, the moving position of the transfer arm can be made appropriate.

In particular, in the above embodiment, at the time of detection of the position of delivery between the transfer arm and the mounting part A, both positions in the vertical direction when the position detecting wafer S is delivered from the transfer arm onto the mounting part A and when the position detecting wafer S is delivered from the mounting part A to the transfer arm are detected. The delivery positions in the vertical direction may differ between the case of delivery from the transfer arm to the mounting part A and the case of delivery from the mounting part A to the transfer arm, and therefore the detection of both delivery positions can make the moving position of the transfer arm appropriate more accurately.

Similarly, when the position detecting wafer S is mounted from the transfer arm onto the mounting part A via the rising/lowering pins as in the case of the mounting plate 90, the second capacitance detection electrode 153 on the position detecting wafer S detects a variation in distance to the support portion of the transfer arm to detect the position in the vertical direction of delivery of the position detecting wafer S between the transfer arm and the rising/lowering pins. This allows for adjustment of the lowering position and the lowering distance of the transfer arm at the time of delivery. For example, if the transfer arm starts to lower from a position higher than necessary or lowers to a position lower than necessary with respect to the actual delivery position of the position detecting wafer S, the moving position of the transfer arm can be made appropriate.

Further, also in the above embodiment, at the time of detection of the position of delivery between the transfer arm and the rising/lowering pins, both positions in the vertical direction when the position detecting wafer S is delivered from the transfer arm onto the rising/lowering pins and when the position detecting wafer S is delivered from the rising/lowering pins to the transfer arm are detected. The delivery positions in the vertical direction may differ between the case of delivery from the transfer arm to the rising/lowering pins and the case of delivery from the rising/lowering pins to the transfer arm, and therefore the detection of both delivery positions can make the moving position of the transfer arm appropriate more accurately.

In the above embodiment, the position in the vertical direction of the position detecting wafer S above the mounting part A is detected when the transfer arm has entered the space above the mounting part A, so that the height of the transfer arm at entry can be adjusted based on the detected position. This can adjust the entry height and so on of the transfer arm, for example, with respect to the transfer port of the unit to prevent contact between the transfer arm and a member of the unit.

In the above embodiment, the capacitance detection sensor 150 on the position detecting wafer S may detect the distances to a plurality of target objects formed on the mounting part A when the transfer arm has entered to the space above the mounting part A, to detect the horizontality of the position detecting wafer S on the transfer arm. For example, as shown in FIG. 18A, the fourth capacitance detection electrodes 155 at four locations on the position detecting wafer S detect the distances to the front surface of the cooling plate 61 when the transfer arm 21 has entered to the space above the cooling plate 61. By comparing the these distances at four points between the fourth capacitance detection electrodes 155 and the front surface of the cooling plate 61, the horizontality of the position detecting wafer S on the transfer arm 21 is detected. For example, when the distances at the four points between the fourth capacitance detection electrodes 155 and the front surface of the cooling plate 61 are different, the inclination of the position detecting wafer S is detected so that, for example, the inclination of the transfer arm 21 is corrected. This ensures the horizontality of the position detecting wafer S on the transfer arm 21.

Though the delivery units 80, 110, and 131 are for mounting the wafer W on the mounting plate 90 in the above embodiment, they may be a delivery unit for mounting the wafer W on three mounting pins provided on a base. Hereinafter, the position adjustment of the transfer arm 21 to the delivery unit 80 in this case will be described. Note that third capacitance detection electrodes 154 on the position detecting wafer S are provided at positions corresponding to the three mounting pins.

Figure 21A:
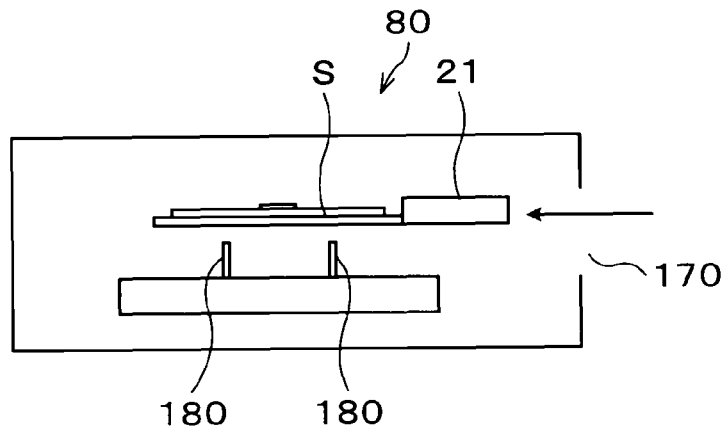
FIG. 21A is an explanatory view showing an appearance in which the transfer arm has entered a space above mounting pins in the delivery unit.

The transfer arm 21 first advances to a position higher than mounting pins 180 in the delivery unit 80 by several millimeters (for example, about 3 mm) from their tips as shown in FIG. 21A. The third capacitance detection electrode 154 then detects the distance to the mounting pins 180. This allows for detection of the height of the transfer arm 21 when it has entered the space above the mounting pins 180 at a design value. For example, if the height of the transfer arm 21 at entry is not appropriate, the control unit 140 adjusts the entry height of the transfer arm 21.

Figure 21B:
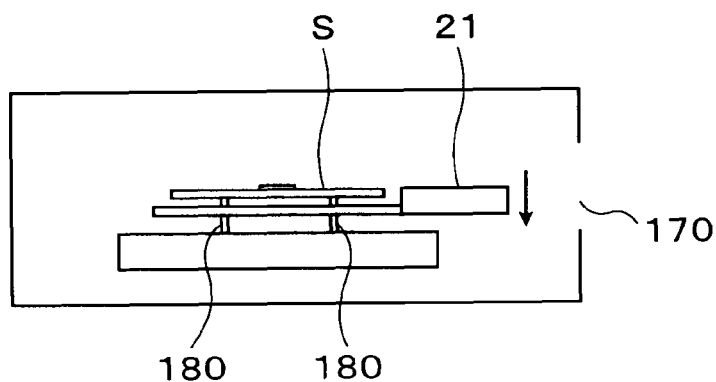
FIG. 21B is an explanatory view showing an appearance in which the position detecting wafer has been mounted on the mounting pins.

The transfer arm 21 then lowers by a predetermined distance to deliver the position detecting wafer S to the mounting pins 180 as shown in FIG. 21B. In this event, the second capacitance detection electrode 153a detects a position (an OFF point) at a moment when the position detecting wafer S is separated from the support portion 22 of the transfer arm 21. Thereafter, the transfer arm 21 rises, so that the position detecting wafer S is delivered from the mounting pins 180 onto the transfer arm 21 (the state in FIG. 21A). In this event, the second capacitance detection electrode 153a detects a position (an ON point) at a moment when the position detect-ing wafer S is supported on the support portion 22 of the transfer arm 21. By detecting the OFF point and the ON point, the delivery position by the transfer arm 21 in the vertical direction between the position detecting wafer S and the mounting pins 180 is detected. For example, when the delivery position is not appropriate, the entry height of the transfer arm 21 to above the mounting pins 180 and the lowering distance at the time of delivery to the mounting pins 180 and so on are corrected in the control unit 140.

Then, the transfer arm 21 lowers to mount the position detecting wafer S onto the mounting pins 180. The capacitance between the third capacitance detection electrode 154 and the mounting pin 180 is then detected, whereby the relative positional relation between the position detecting wafer S and the mounting pin 180 is detected. Thereby, the mounting position of the position detecting wafer S on the mounting pin 180 is detected. If the center of the position detecting wafer S is displaced from the center among the mounting pins 180, the displacement amount is calculated and the moving position of the transfer arm 21 when transferring is adjusted.

In the above example, the third capacitance detection electrodes 154 at three location may be used to detect the distances between the third capacitance detection electrodes 154 and the mounting pins 180. By comparing these distances between the third capacitance detection electrodes 154 and the mounting pins 180, the horizontality of the wafer W when mounted can be detected. For example, when the wafer W is not horizontal, the height adjustment of attach portions of the mounting pins 180 is performed.

Figure 22:
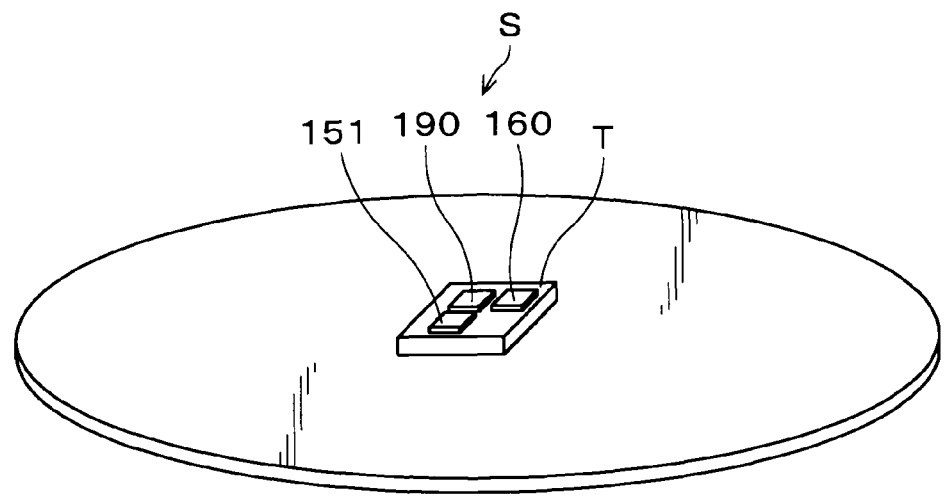
FIG. 22 is a perspective view of a position detecting wafer provided with an acceleration sensor.

In the above embodiment, an acceleration sensor 190 may be provided at the center on the front surface of the position detecting wafer S as shown in FIG. 22 so that the mounting position of the position detecting wafer S on the mounting part A may be detected using the acceleration sensor 190 on the mounting part A having a rotation function as the spin chuck 40. In this case, the position detecting wafer S is mounted, for example, by the transfer arm 21 onto the spin chuck 40, and the spin chuck 40 is then rotated. The acceleration of the rotation is detected by the acceleration sensor 190 on the position detecting wafer S, and the displacement between the center of the position detecting wafer S and the center of the spin chuck 40 is detected from a directional component of the acceleration. This allows for detection of the mounting position of the position detecting wafer S on the spin chuck 40. For example, if the position of the position detecting wafer S is displaced, the displacement amount between the center of the position detecting wafer S and the spin chuck 40 is calculated, for example, from the detection result of the acceleration sensor 190, so that the position adjustment of the transfer arm 21 is performed using the displacement amount as a correction amount.

A preferred embodiment of the present invention has been described above with reference to the accompanying drawings, and the present invention is not limited to the embodiment. It should be understood that various changes and modifications within the scope of the spirit as set forth in claims are readily apparent to those skilled in the art, and those should also be covered by the technical scope of the present invention. For example, though a position detecting jig described in the above embodiment is in a circular wafer shape, the jig may be in other shapes, such as a square shape when the product substrate is in a square.

The present invention is useful in performing the position adjustment of a transfer arm to a low-profile unit with a high accuracy and at a low cost.

What is claimed is:

1. A method of adjusting a moving position of a transfer arm, the transfer arm transferring a substrate to a mounting part for mounting the substrate thereon, said method comprising the steps of:
   supporting on the transfer arm a position detecting jig in a substrate shape having a capacitive sensor, the capacitive sensor being capable of detecting a capacitance between the capacitive sensor and a target object to detect a relative position to the target object;
   transferring the position detecting jig by the transfer arm and mounting the position detecting jig onto the mounting part;
   detecting a position of the position detecting jig with respect to a target object formed on the mounting part by the capacitive sensor on the position detecting jig to detect a mounting position of the position detecting jig on the mounting part;
   adjusting a moving position of the transfer arm when transferring the position detecting jig based on the mounting position of the position detecting jig; and
   when moving the position detecting jig by the transfer arm to above the mounting part, then delivering the position detecting jig to a rising/lowering member of the mounting part, and then lowering the position detecting jig by the rising/lowering member to mount the position detecting jig onto the mounting part,
      detecting a position of the position detecting jig with respect to the rising/lowering member as a target object by the capacitive sensor on the position detecting jig before lowering the position detecting jig, to detect a position in a horizontal direction of the position detecting jig above the mounting part.

2. The method of adjusting a moving position of a transfer arm as set forth in claim 1, further comprising the step of:
   when moving the position detecting jig by the transfer arm to above the mounting part, then delivering the position detecting jig to a rising/lowering member of the mounting part, and then lowering the position detecting jig by the rising/lowering member to mount the position detecting jig onto the mounting part,
      detecting a variation in distance between a support portion for the position detecting jig on the transfer arm and an electrode of the capacitive sensor on the position detecting jig provided at a position corresponding to the support portion to detect a position in a vertical direction at the time of delivery of the position detecting jig between the transfer arm and the rising/lowering member; and
      adjusting a moving position of the transfer arm based on the position in the vertical direction.

3. The method of adjusting a moving position of a transfer arm as set forth in claim 2, wherein the positions in the vertical direction when the position detecting jig is delivered from the transfer arm to the rising/lowering member and when the position detecting jig is delivered from the rising/lowering member to the transfer arm are detected.

4. The method of adjusting a moving position of a transfer arm as set forth in claim 1,
   wherein when the mounting part has a function of rotating the substrate mounted thereon, an acceleration sensor is provided at a center of the position detecting jig, and
   wherein the position detecting jig is mounted on the mounting part, the position detecting jig is rotated by the mounting part, and the acceleration sensor, in place of the capacitive sensor, detects an acceleration of the rotation of the position detecting jig to detect the mounting position of the position detecting jig on the mounting part.

5. The method of adjusting a moving position of a transfer arm as set forth in claim 1, further comprising the step of:
   when moving the position detecting jig by the transfer arm to above the mounting part,
      detecting distances to a plurality of target objects formed on the mounting part by the capacitive sensor on the position detecting jig to detect a horizontality of the position detecting jig on the transfer arm.

6. A position detecting jig for adjusting a moving position of a transfer arm, said transfer arm transferring a substrate to a mounting part for mounting the substrate thereon, said position detecting jig comprising:
   a body that has a shape and a size that is the same as the substrate, that is transferable by said transfer arm, and has a capacitive sensor which detects a capacitance between said capacitive sensor and a target object, said capacitive sensor including
      a capacitance detection electrode which forms a capacitance between said capacitance detection electrode and the target object, and
      a control circuit connected to said capacitance detection electrode which controls an operation of detecting the capacitance,
   wherein said capacitance detection electrode includes a first capacitance detection electrode provided at a central portion of the substrate shape and capable of detecting a relative position to the target object at a center of said mounting part, a second capacitance detection electrode provided at a position corresponding to a support portion of said transfer arm, and a third capacitance detection electrode capable of detecting a relative position to a rising/lowering member for raising/lowering the substrate on or above said mounting part.

7. The position detecting jig as set forth in claim 6, wherein said capacitance detection electrode has other capacitance detection electrodes provided at positions corresponding to a plurality of target objects on an upper surface of said mounting part.

* * * * *